United States Patent
Wang

(10) Patent No.: US 10,706,783 B2
(45) Date of Patent: Jul. 7, 2020

(54) COMPENSATION SUB-PIXEL UNIT, METHODS OF FABRICATING AND DRIVING THE SAME, AND PIXEL STRUCTURE AND DISPLAY PANEL USING THE SAME

(71) Applicant: BOE TECHNOLOGY GROUP CO., LTD., Beijing (CN)

(72) Inventor: Jinqian Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/506,433

(22) Filed: Jul. 9, 2019

(65) Prior Publication Data

US 2020/0135111 A1    Apr. 30, 2020

(30) Foreign Application Priority Data

Oct. 26, 2018   (CN) .......................... 2018 1 1260722

(51) Int. Cl.
  *G09G 3/3258* (2016.01)
  *H01L 41/08* (2006.01)
  *G09G 3/3291* (2016.01)

(52) U.S. Cl.
  CPC ......... *G09G 3/3258* (2013.01); *G09G 3/3291* (2013.01); *H01L 41/0805* (2013.01)

(58) Field of Classification Search
  None
  See application file for complete search history.

(56) References Cited

U.S. PATENT DOCUMENTS

| 9,305,980 B2 | 4/2016 | Kim |
| 2008/0174852 A1 | 7/2008 | Hirai et al. |
| 2008/0186259 A1* | 8/2008 | Todorokihara ......... G09G 3/344 345/76 |
| 2017/0219444 A1 | 8/2017 | Kim et al. |

(Continued)

FOREIGN PATENT DOCUMENTS

| CN | 1682271 A | 10/2005 |
| CN | 103514826 A | 1/2014 |
| CN | 103713436 A | 4/2014 |

(Continued)

OTHER PUBLICATIONS

Chinese Office Action dated Jan. 21, 2020, from application No. 201811260722.5.

*Primary Examiner* — Duane N Taylor, Jr.
(74) *Attorney, Agent, or Firm* — Foley & Lardner LLP

(57) ABSTRACT

The present disclosure relates to display technology field, particularly to a compensation sub-pixel unit, a method of fabricating the compensation sub-pixel unit, a method of driving the compensation sub-pixel unit, a pixel structure and a display panel. The compensation sub-pixel unit includes a piezoelectric film. The compensation sub-pixel unit includes a switching transistor that has a control end connected to the piezoelectric film layer, and a first end connected to a data voltage signal end. The compensation sub-pixel unit includes a driving transistor that has a control end connected to a gate voltage signal end, a first end connected to a second end of the switching transistor, and a second end connected to a power signal end.

19 Claims, 24 Drawing Sheets

(56) References Cited

U.S. PATENT DOCUMENTS

2017/0285828 A1* 10/2017 Grosse-Puppendahl ..................... G06F 3/0414
2019/0377962 A1* 12/2019 Kitchens ............ G01N 29/2418

FOREIGN PATENT DOCUMENTS

| | | |
|---|---|---|
| CN | 105047085 A | 11/2015 |
| CN | 106910842 A | 6/2017 |
| CN | 106952580 A | 7/2017 |
| CN | 107170375 A | 9/2017 |
| CN | 107342046 A | 11/2017 |
| CN | 107454932 A | 12/2017 |
| CN | 107705748 A | 2/2018 |
| CN | 108022553 A | 5/2018 |
| CN | 108565282 A | 9/2018 |
| CN | 108649054 A | 10/2018 |
| JP | 2015-072465 A | 4/2015 |
| JP | 2018-081503 A | 5/2018 |
| KR | 20170074614 A | 6/2017 |

* cited by examiner

Forming the switching transistor and the driving transistor, wherein the first end of the switching transistor is connected to the data voltage signal end, the second end of the switching transistor is connected to the first end of the driving transistor, the control end of the driving transistor is connected to the gate voltage signal end, and the second end of the driving transistor is connected to the power signal end — S100

Forming the piezoelectric film connected to the control end of the switching transistor — S102

Fig. 12

Forming the metal conductive layer, wherein the metal conductive layer is contacted with the second gate through the first via hole — S10121

Forming the transparent conductive layer, wherein the transparent conductive layer is electrically connected to the metal conductive layer and filled in the second via hole — S10122

Fig. 15

COMPENSATION SUB-PIXEL UNIT, METHODS OF FABRICATING AND DRIVING THE SAME, AND PIXEL STRUCTURE AND DISPLAY PANEL USING THE SAME

CROSS REFERENCE

This application is based upon and claims priority to Chinese Patent Application No. 201811260722.5, filed on Oct. 26, 2018, the entire contents thereof are incorporated herein by reference.

TECHNICAL FIELD

The present disclosure relates to the field of display technology, and particularly to a compensation sub-pixel unit, a method of fabricating the compensation sub-pixel unit, a method of driving the compensation sub-pixel unit, a pixel structure using the compensation sub-pixel unit and a display panel using the compensation sub-pixel unit.

BACKGROUND

With the development of self-luminous display technology, OLED (Organic Light Emitting Diode) displays gradually replace the traditional LCDs (Liquid Crystal Displays) because of OLED displays' low power consumption, low cost, wide viewing angle and fast response.

At present, a type of flexible AMOLED (Active-Matrix Organic Light Emitting Diode) display is provided on the market, that is, such AMOLED display can be deformed to meet different needs of users. However, when the AMOLED display is deformed, its pixel resolution will decrease.

It should be understood that information disclosed in the background section above is only for enhancing the comprehension of the background of the present disclosure, and thus may include information that does not constitute prior art known to those ordinary skilled in the art.

SUMMARY

The present disclosure provides various arrangements of a compensation sub-pixel unit, a method of fabricating the compensation sub-pixel unit, a method of driving the compensation sub-pixel unit, a pixel structure and a display panel, for at least partially solving the problem that pixel resolution decreases when the display panel is deformed.

Arrangements of a first aspect of the present disclosure provides a compensation sub-pixel unit. The compensation sub-pixel unit includes a piezoelectric film. The compensation sub-pixel unit includes a switching transistor that has a control end connected to the piezoelectric film layer, and a first end connected to a data voltage signal end. The compensation sub-pixel unit includes a driving transistor that has a control end connected to a gate voltage signal end, a first end connected to a second end of the switching transistor, and a second end connected to a power signal end.

In an exemplary arrangement of the present disclosure, the compensation sub-pixel unit further includes a substrate. The driving transistor and the switching transistor are formed on the same side of the substrate. The driving transistor includes a first active layer, a first gate, a first source and a first drain. The first gate is formed as the control end of the driving transistor. The first source is formed as the first end of the driving transistor. The first drain is formed as the second end of the driving transistor. The switching transistor includes a second active layer, a second gate, a second source and a second drain. The second gate is formed as the control end of the switching transistor. The second source is formed as the first end of the switching transistor. The second drain is formed as the second end of the switching transistor.

In an exemplary arrangement of the present disclosure, the first active layer and the second active layer are disposed in the same layer on the substrate. The first active layer and the second active layer have an interval therebetween. A gate insulating layer is further formed on the substrate. The gate insulating layer covers the first active layer and the second active layer. The first gate and the second gate are disposed in the same layer on the gate insulating layer. The first gate and the second gate have an interval therebetween. An interlayer dielectric layer is further formed on the gate insulating layer. The interlayer dielectric layer covers the first gate and the second gate. The first source, the first drain, the second source and the second drain are disposed in the same layer on the interlayer dielectric layer. The first drain and the first source have an interval therebetween. The first drain and the first source pass through the interlayer dielectric layer and the gate insulating layer in sequence and are in contact with the first active layer. The second drain is connected to the first source and has an interval with the second source. The second source and the second drain pass through the interlayer dielectric layer and the gate insulating layer in sequence and are in contact with the second active layer.

In an exemplary arrangement of the present disclosure, the compensation sub-pixel unit further includes a passivation layer that covers the interlayer dielectric layer, the first source, the first drain, the second source and the second drain. The compensation sub-pixel unit further includes a first via hole, disposed in the passivation layer and the interlayer dielectric layer, and exposing a portion of the second gate. The compensation sub-pixel unit further includes a second via hole, disposed in the passivation layer and the interlayer dielectric layer, and exposing a portion of the gate insulating layer. The compensation sub-pixel unit further includes a conductive layer, covering a portion of the passivation layer and filled in the first via hole and the second via hole. The conductive layer is contacted with the second gate through the first via hole. The compensation sub-pixel unit further includes a conductive hole disposed in the conductive layer and located in the second via hole. The piezoelectric film is formed in the conductive hole and electrically connected to the second gate through the conductive layer.

In an exemplary arrangement of the present disclosure, the conductive layer includes a metal conductive layer contacted with the second gate through the first via hole. The conductive layer includes a transparent conductive layer, electrically connected to the metal conductive layer and filled in the second via hole. The conductive hole is disposed in the transparent conductive layer.

In an exemplary arrangement of the present disclosure, the compensation sub-pixel unit further includes a flat layer that covers the passivation layer, the conductive layer and the piezoelectric film. The compensation sub-pixel unit further includes an anode layer, covering a portion of the flat layer, passing through the flat layer and the passivation layer in sequence, and in contact with the first drain. The compensation sub-pixel unit further includes a pixel definition layer, covering the flat layer and the anode layer. The compensation sub-pixel unit further includes an organic light emitting layer, disposed in the pixel definition layer, and in contact with the anode layer. The compensation sub-pixel unit further includes a cathode layer, covering the pixel definition layer and the organic light emitting layer, and in contact with the organic light emitting layer.

A second aspect of the present disclosure provides a method of driving a compensation sub-pixel unit. The compensation sub-pixel unit is the compensation sub-pixel unit according to any one of the above arrangements. The driving method includes when the piezoelectric film is deformed to generate a voltage control signal, transmitting, by the switching transistor, a data voltage signal provided by the data voltage signal end to the first end of the driving transistor under an action of the voltage control signal, to make the driving transistor to be in an on state.

A third aspect of the present disclosure provides a method of fabricating a compensation sub-pixel unit. The method includes forming a switching transistor and a driving transistor. A first end of the switching transistor is connected to a data voltage signal end, a second end of the switching transistor is connected to a first end of the driving transistor, a control end of the driving transistor is connected to a gate voltage signal end, and a second end of the driving transistor is connected to a power signal end. The method includes forming a piezoelectric film connected to a control end of the switching transistor.

In an exemplary arrangement of the present disclosure, forming the switching transistor and the driving transistor includes forming the switching transistor and the driving transistor on the same side of a substrate. The driving transistor includes a first active layer, a first gate, a first source and a first drain. The first gate is formed as the control end of the driving transistor. The first source is formed as the first end of the driving transistor. The first drain is formed as the second end of the driving transistor. The switching transistor includes a second active layer, a second gate, a second source and a second drain. The second gate is formed as the control end of the switching transistor. The second source is formed as the first end of the switching transistor. The second drain is formed as the second end of the switching transistor. In an exemplary arrangement of the present disclosure, forming the switching transistor and the driving transistor on the same side of the substrate includes forming the first active layer and the second active layer disposed in the same layer on the substrate. The first active layer and the second active layer have an interval therebetween. Forming the switching transistor and the driving transistor includes forming a gate insulating layer on the substrate, wherein the gate insulating layer covers the first active layer and the second active layer. Forming the switching transistor and the driving transistor includes forming the first gate and the second gate disposed in the same layer on the gate insulating layer, wherein the first gate and the second gate have an interval therebetween. Forming the switching transistor and the driving transistor includes forming an interlayer dielectric layer on the gate insulating layer, wherein the interlayer dielectric layer covers the first gate and the second gate. Forming the switching transistor and the driving transistor includes forming the first source, the first drain, the second source and the second drain disposed in the same layer on the interlayer dielectric layer. The first drain and the first source have an interval therebetween, the first drain and the first source pass through the interlayer dielectric layer and the gate insulating layer in sequence and are in contact with the first active layer, the second drain is connected to the first source and have an interval with the second source, and the second source and the second drain passes through the interlayer dielectric layer and the gate insulating layer in sequence and are in contact with the second active layer.

In an exemplary arrangement of the present disclosure, the fabricating method, after forming the switching transistor and the driving transistor, and before forming the piezoelectric film, further includes forming a passivation layer. The passivation layer covers the interlayer dielectric layer, the first source, the first drain, the second source and the second drain. The fabricating method further includes forming a first via hole and a second via hole, wherein the first via hole and the second via hole are disposed in the passivation layer and the interlayer dielectric layer, and respectively expose a portion of the second gate and a portion of the gate insulating layer. The fabricating method further includes forming a conductive layer. The conductive layer covers a portion of the passivation layer and is filled in the first via hole and the second via hole, and is contacted with the second gate through the first via hole. The fabricating method further includes forming a conductive hole, wherein the conductive hole is disposed in the conductive layer and located in the second via hole, and the piezoelectric film is formed in the conductive hole and electrically connected to the second gate through the conductive layer.

In an exemplary arrangement of the present disclosure, forming the conductive layer includes forming a metal conductive layer. The metal conductive layer is contacted with the second gate through the first via hole. Forming the conductive layer includes forming a transparent conductive layer. The transparent conductive layer is electrically connected to the metal conductive layer and filled in the second via hole, and the conductive hole is disposed in the transparent conductive layer.

In an exemplary arrangement of the present disclosure, the fabricating method, after forming the piezoelectric film, further includes forming a flat layer, wherein the flat layer covers the passivation layer, the conductive layer and the piezoelectric film. The fabricating method further includes forming an anode layer. The anode layer covers a portion of the flat layer, and passes through the flat layer and the passivation layer in sequence and is in contact with the first drain. The fabricating method further includes forming a pixel definition layer, wherein the pixel definition layer covers the flat layer and the anode layer. The fabricating method further includes forming an organic light emitting layer, wherein the organic light emitting layer is disposed in the pixel definition layer, and is in forming the piezoelectric film further includes forming a cathode layer. The cathode layer covers the pixel definition layer and the organic light emitting layer, and is in contact with the organic light emitting layer.

A fourth aspect of the present disclosure provides a pixel structure. The pixel structure includes a plurality of pixel units. Each of the pixel units includes a display sub-pixel unit and the compensation sub-pixel unit according to any one of the above arrangements, and a shape of the display sub-pixel unit and the compensation sub-pixel unit includes one or more of a rectangle, a diamond, a circle, an ellipse and a triangle.

In an exemplary arrangement of the present disclosure, the pixel unit includes a first sub-pixel group and a second sub-pixel group. The first sub-pixel group includes a first display sub-pixel unit, a second compensation sub-pixel unit and a third display sub-pixel unit that have the same area and are disposed in sequence in the same column. The second sub-pixel group includes a first compensation sub-pixel unit, a second display sub-pixel unit and a third compensation sub-pixel unit that have the same area and are disposed in sequence in the same column. The first display sub-pixel unit and the first compensation sub-pixel unit are disposed in the same row, the second display sub-pixel and the second compensation sub-pixel unit are disposed in the same row, and the third display sub-pixel unit and the third compensation sub-pixel unit are disposed in the same row. The first display sub-pixel unit, the second display sub-pixel unit and the third display sub-pixel unit are all the display sub-pixel units. The first compensation sub-pixel unit, the second compensation sub-pixel unit and the third compensation sub-pixel unit are all the compensation sub-pixel units.

In an exemplary arrangement of the present disclosure, the pixel unit includes a first sub-pixel group, a second sub-pixel group and a third sub-pixel group. Each of the first sub-pixel group, the second sub-pixel group and the third sub-pixel group includes a first sub-pixel unit, a second sub-pixel unit and a third sub-pixel unit that have the same area and are disposed in sequence in the same column, the first sub-pixel unit and the second sub-pixel unit are the display sub-pixel units, and the third sub-pixel unit includes the display sub-pixel unit and the compensation sub-pixel unit that have the same area and are disposed in the same column. The first sub-pixel unit in the first sub-pixel group, the third sub-pixel unit in the second sub-pixel group, and the second sub-pixel unit in the third sub-pixel group are disposed in sequence in the same row. The second sub-pixel unit in the first sub-pixel group, the first sub-pixel unit in the second sub-pixel group, and the third sub-pixel unit in the third sub-pixel group are disposed in sequence in the same row. The third sub-pixel unit in the first sub-pixel group, the second sub-pixel unit in the second sub-pixel group, and the first sub-pixel unit in the third sub-pixel group are disposed in sequence in the same row.

In an exemplary arrangement of the present disclosure, the pixel unit includes a first sub-pixel group, a second sub-pixel group, and a third sub-pixel group. The first sub-pixel group includes a first display sub-pixel unit, a second display sub-pixel unit and a third compensation sub-pixel unit that are disposed in sequence in the same column. The second sub-pixel group includes a second compensation sub-pixel unit, a first display sub-pixel unit and a third display sub-pixel unit that are disposed in sequence in the same column. The third sub-pixel group includes a third display sub-pixel unit, a second display sub-pixel unit and a first compensation sub-pixel unit that are disposed in sequence in the same column. The first display sub-pixel unit, the second display sub-pixel unit and the third display sub-pixel unit are all the display sub-pixel units, and areas of both the second display sub-pixel unit and the third display sub-pixel unit are one-half of that of the first display sub-pixel unit. The first compensation sub-pixel unit, the second compensation sub-pixel unit and the third compensation sub-pixel unit are all the compensation sub-pixel units, and areas of both the second compensation sub-pixel unit and the third compensation sub-pixel unit are one-half of that the first compensation sub-pixel unit. The first display sub-pixel unit has the same area as that of the first compensation sub-pixel unit. The second display sub-pixel unit has the same area as that of the second compensation sub-pixel unit. The third display sub-pixel unit has the same area as that of the third compensation sub-pixel unit.

In an exemplary arrangement of the present disclosure, the pixel unit includes a first sub-pixel group, a second sub-pixel group, and a third sub-pixel group and a fourth sub-pixel group respectively disposed staggeredly with the first sub-pixel group and the second sub-pixel group. Each of the first sub-pixel group and the second sub-pixel group includes a first display sub-pixel unit and a second display sub-pixel unit that are disposed alternately in the same row, the first display sub-pixel unit and the second display sub-pixel unit are the display sub-pixel units, and an area of the first display sub-pixel unit is larger than that of the second display sub-pixel unit. Each of the third sub-pixel group and the fourth sub-pixel group includes a third display sub-pixel unit and the compensation sub-pixel unit that are disposed alternately in the same row, the third display sub-pixel unit is the display sub-pixel unit, and an area of the compensation sub-pixel unit is the same as that of the third display sub-pixel unit. The first display sub-pixel unit in the first sub-pixel group and the second display sub-pixel unit in the second sub-pixel group are disposed in the same column, and the second display sub-pixel unit in the first sub-pixel group and the first display sub-pixel unit in the second sub-pixel group are disposed in the same column. The third display sub-pixel unit in the third sub-pixel group and the compensation sub-pixel unit in the fourth sub-pixel group are disposed in the same column, the compensation sub-pixel unit in the third sub-pixel group and the third display sub-pixel unit in the fourth sub-pixel group are disposed in the same column, and the third display sub-pixel unit and the compensation sub-pixel unit are respectively located among the first display sub-pixel units and the second display sub-pixel units that are adjacent to each other.

A fifth aspect of the present disclosure provides a display panel, including: the pixel structure according to any one of the above arrangements.

The technical solution provided by the present disclosure may achieve the following improvements.

The compensation sub-pixel unit, the method of fabricating the compensation sub-pixel unit, the method of driving the compensation sub-pixel unit, the pixel structure and the display panel provided by the present disclosure, by connecting one end of the driving transistor in the compensation sub-pixel unit of the pixel structure in the display panel to a switching transistor controlled to be turned on or off by the piezoelectric film, and deforming the piezoelectric film to generate a control voltage signal when the display panel is deformed, wherein the control voltage signal may be transmitted to the control end of the switching transistor to make the switching transistor to be in an on state, and when the switching transistor is in the on state and the driving transistor turns into an on state that may drive the compensation sub-pixel unit to normally emit light, can compensate the pixel resolution of the deformed display panel, that is, the pixel resolution of the display panel is kept unchanged during deformation. In addition, when the display panel is not deformed, the piezoelectric film is not squeezed, so no control voltage signal is generated, and the switching transistor is in a non-conducting state at this time; and since the switching transistor is in the non-conducting state, the driving transistor may not drive the compensation sub-pixel unit to emit light, which may reduce power consumption of the display panel when it is not deformed.

It should be understood that the above general description and the following detailed description are only exemplary and explanatory, which cannot limit the present disclosure.

BRIEF DESCRIPTION OF THE DRAWINGS

The accompanying drawings, which are incorporated in the specification and constitute a part of the specification, show the arrangements in compliance with the present disclosure, and are used to interpret the principle of the present disclosure together with the description. It is apparent that the drawings in the following description are only some arrangements of the present disclosure, from which, other drawings may be obtained by those ordinary skilled in the art without paying any creative labor.

FIG. 12 is a flowchart of a method of fabricating a compensation sub-pixel unit according to an arrangement of the present disclosure;

FIG. 15 is a schematic flowchart of block S1012 in FIG. 14;

DESCRIPTION OF THE REFERENCE NUMERALS

Figure 1:
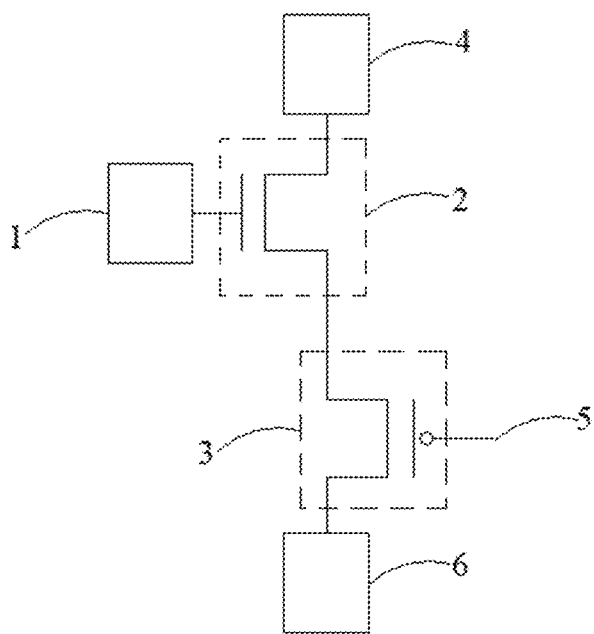
FIG. 1 is a schematic circuit diagram of a compensation sub-pixel unit according to an arrangement of the present disclosure.
Figure 2:
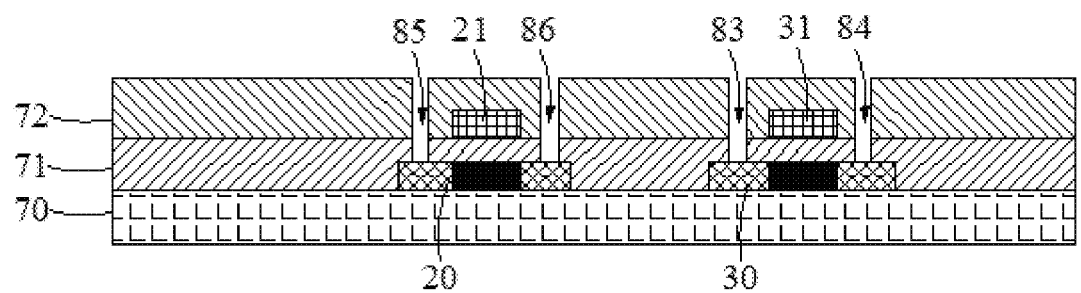
FIG. 2 to FIG. 11 are schematic diagrams of blocks of a method of fabricating a compensation sub-pixel unit according to an arrangement of the present disclosure.

In FIG. 1 to FIG. 11 and FIG. 17 to FIG. 22:
1. Piezoelectric film; 2. Switching transistor; 20. Second active layer; 21. Second gate; 22. Second source; 23. Second drain; 3. Driving transistor; 30. First source layer; 31. First gate; 32. First source; 33. First drain; 4 Data voltage signal end; 5 Gate voltage signal end; 6. Power signal end; 70. Substrate; 71 Gate insulating layer; 72. Interlayer dielectric layer; 73. Passivation layer; 74. First via hole; 75. Second via hole; 760. Metal conductive layer; 761. Transparent conductive layer; 77. Conductive hole; 78. Flat layer; 79. Anode layer; 80. Pixel definition layer; 81. Organic light emitting layer; 82. Cathode layer; 83. First matching hole; 84. Second matching hole; 85. Third matching hole; 86. Fourth matching hole; 87. Fifth matching hole; 88. Sixth matching hole; 89. Seventh matching hole; 90. Red display sub-pixel unit; 91. Blue display sub-pixel unit; 92. Green display sub-pixel unit; 93. Red compensation sub-pixel unit; 94. Blue compensation sub-pixel unit; and 95. Green compensation sub-pixel unit.

DETAILED DESCRIPTION

Exemplary arrangements will now be described more fully with reference to the accompanying drawings. However, the exemplary arrangements can be embodied in a variety of forms, and should not be construed as limited in the examples set forth herein. On the contrary, these arrangements are provided so that this disclosure will be more comprehensive and complete, and the concept of the exemplary arrangements may be fully conveyed to those skilled in the art. The same reference numerals in the drawings represent the same or similar parts, and the detailed description thereof will be omitted.

Although relative terms such as "upper" and "lower" are used in this specification to describe the relative relationship between one component and another component, these terms are used in this specification only for convenience, to illustrate such as the orientation of the arrangements described in the drawings. It should be understood that, if the device in the figure is flipped upside down, the component described as "above" will become the component as "below". When a structure is "on" another structure, it may mean that the structure is integrally formed on the said another structure, or that the structure is "directly" disposed on the said another structure, or that the structure is "indirectly" disposed on the said another structure through a further another structure.

The terms "a", "an", "the", "said" are used to express the presence of one or more elements/components, etc.; the terms "include" and "have" are used to express the meaning of an opening inclusion, and refer to that, in addition to the listed elements, components, etc., there may be additional elements, components, etc.; and the terms "first", "second", "third", "fourth", "fifth", "sixth", and "seventh" are used merely as labels, and are not limited to the number of objects.

At present, a type of flexible AMOLED (Active-Matrix Organic Light Emitting Diode) display is provided on the market, that is, such AMOLED display can be deformed to meet different needs of users. However, when the AMOLED display is deformed, its pixel resolution will decrease.

To solve the above technical problem, arrangements of the present disclosure provide a compensation sub-pixel unit, and the compensation sub-pixel unit may have certain flexibility and may be applied to a pixel structure of a flexible display panel. The display panel mentioned here may be an AMOLED display panel.

As shown in FIG. 1, the compensation sub-pixel unit in this arrangement may include a piezoelectric film 1, a switching transistor 2 and a driving transistor 3, wherein, the piezoelectric film 1 may be a PVDF (Polyvinylidene fluoride) polymer film, and the piezoelectric film 1 may generate a control voltage signal when it is deformed (that is, when the piezoelectric film 1 is subjected to a tensile force or bending force).

A control end of the switching transistor 2 is connected to the piezoelectric film layer, and the control voltage signal generated by the piezoelectric film layer may be input to the control end of the switching transistor 2; and a first end of the switching transistor 2 is connected to a data voltage signal end 4, and the data voltage signal end 4 is used for supplying a data voltage signal to the first end of the switching transistor 2. The switching transistor 2 may input the data voltage signal provided by the data voltage signal end 4 to a second end of the switching transistor 2 under the control of the control voltage signal, that is, when the control voltage signal and the data voltage signal are respectively input to the control end and the first end of the switching transistor 2, the switching transistor 2 may be in an on state to transfer the data voltage signal.

A control end of the driving transistor 3 is connected to a gate voltage signal end 5, and the gate voltage signal end 5 is used for supplying a gate voltage signal to the control end of the driving transistor 3; a first end of the driving transistor 3 is connected to a second end of the switching transistor 2, and the second end of the switching transistor 2 may transmit the data voltage signal provided by the data voltage signal end 4 to the first end of the driving transistor 3; and the second end of the driving transistor 3 is connected to an organic light emitting layer (not shown in FIG. 1) and a power signal end 6, and the power signal end 6 is used for supplying a power signal to the second end of the driving transistor 3. When the gate voltage signal and the data voltage signal are respectively input to the control end and the first end of the driving transistor 3, the driving transistor 3 may be in an on state to transfer the data voltage signal to the organic light emitting layer.

In this arrangement, one end of the driving transistor 3 in the compensation sub-pixel unit is connected to the switching transistor 2 controlled to be turned on or off by the piezoelectric film 1, such that, when the piezoelectric film 1 is deformed and generates the control voltage signal as the display panel is deformed, the control voltage signal may be transmitted to the control end of the switching transistor 2 to enable the switching transistor 2 to be in an on state. When the switching transistor 2 is in the on state and the driving transistor 3 turns into an on state, it may drive the organic light emitting layer of the compensation sub-pixel unit to normally emit light, to compensate the pixel resolution of the deformed display panel, that is, to keep the pixel resolution of the display panel unchanged during deformation. In addition, when the display panel is not deformed, the piezoelectric film 1 is not squeezed, so no control voltage signal is generated, then the switching transistor 2 is in a non-conducting state at this time. Since the switching transistor 2 is in the non-conducting state, the driving transistor 3 may not drive the organic light emitting layer of the compensation sub-pixel unit to emit light, which may reduce power consumption of the display panel when it is not deformed.

The structure of the compensation sub-pixel unit in this arrangement will be specifically described below with reference to the accompanying drawings.

The compensation sub-pixel unit may further include a substrate 70 in addition to the driving transistor 3, switching transistor 2 and piezoelectric film 1. The substrate 70 may be a flexible substrate, and the substrate 70 may be a transparent substrate as well, such as a glass substrate, a plastic substrate, or the like.

The driving transistor 3 mentioned above may be formed on the substrate 70, and the driving transistor 3 may include a first active layer 30, a first gate 31, a first source 32 and a first drain 33. The first gate 31 may be formed as the control end of the driving transistor 3, the first source 32 may be formed as the first end of the driving transistor 3, and the first drain 33 may be formed as the second end of the driving transistor 3.

The switching transistor 2 may be formed on the substrate 70 as well, and the switching transistor 2 may include a second active layer 20, a second gate 21, a second source 22 and a second drain 23. The second gate 21 may be formed as the control terminal of the switching transistor 2, the second source 22 may be formed as the first end of the switching transistor 2, and the second drain 23 may be formed as the second end of the switching transistor 2.

For example, the driving transistor 3 and the switching transistor 2 may be formed on the same side of the substrate 70 to reduce processing difficulty of the compensation sub-pixel unit.

Specifically, a structural relationship between the driving transistor 3 and the switching transistor 2 is as follows.

As shown in FIG. 2 to FIG. 11, the first active layer 30 and the second active layer 20 may be disposed in the same layer on the substrate 70, and the first active layer 30 and the second active layer 20 have an interval, wherein the material of the first active layer 30 and the second active layer 20 may be polysilicon or oxide semiconductor material.

A gate insulating layer 71 may be formed on the substrate 70, and the gate insulating layer 71 may cover the first active layer 30 and the second active layer 20, in other words, the gate insulating layer 71 may cover the substrate 70, the first active layer 30 and the second active layer 20 collectively, wherein the material of the gate insulating layer 71 may be one or more of silicon dioxide, silicon nitride, silicon oxynitride, and aluminum oxide.

The first gate 31 and the second gate 21 may be disposed in the same layer on the gate insulating layer 71, and the first gate 31 and the second gate 21 have an interval, for example, the material of the first gate 31 and the second gate 21 may include one or more of aluminum, aluminum alloy, copper, copper alloy, molybdenum, and molybdenum alloy.

An ILD (Interlayer Dielectric) layer 72 may be formed on the gate insulating layer 71, and the interlayer dielectric layer 72 may cover the first gate 31 and the second gate 21, in other words, the interlayer dielectric layer 72 may collectively cover the gate insulating layer 71, the first gate 31 and the second gate 21, wherein the material of the interlayer dielectric layer 72 may be one or more of silicon dioxide, silicon nitride, and silicon oxynitride.

The first source 32, the first drain 33, the second source 22 and the second drain 23 may be disposed in the same layer on the interlayer dielectric layer 72, specifically, the first drain 33 and the first source 32 have an interval, and the first drain 33 and the first source 32 sequentially pass through the interlayer dielectric layer 72 and the gate insulating layer 71 and contact with the first active layer 30. The second drain 23 is connected to the first source 32, the connected second drain 23 and the first source 32 may be referred to as a source and drain electrode. The second drain 23 and the second source 22 have an interval, and the second source 22 and the second drain 23 sequentially pass through the interlayer dielectric layer 72 and the gate insulating layer 71 and contact with the second active layer 20. For example, the material of the first source 32, the first drain 33, the second source 22 and the second drain 23 may adopt metal material formed by sequentially stacking metal titanium, metal aluminum and metal titanium.

In this arrangement, by disposing the first active layer 30 and the second active layer 20 in the same layer on the substrate 70, disposing the first gate 31 and the second gate 21 in the same layer on the gate insulating layer 71, and disposing the first source 32, the first drain 33, the second source 22 and the second drain 23 in the same layer on the interlayer dielectric layer 72, it may simplify the structure of the compensation sub-pixel unit, and may reduce processing difficulty of the compensation sub-pixel as well.

As shown in FIG. 3 to FIG. 11, the compensation sub-pixel unit of the arrangement may further include a passivation layer 73 (also referred to as PVX), a first via hole 74, a second via hole 75, a conductive layer and a conductive hole 77.

The passivation layer 73 may cover the interlayer dielectric layer 72, the first source 32, the first drain 33, the second source 22 and the second drain 23, and the material of the passivation layer 73 may be one or more of silicon dioxide, silicon nitride, and silicon oxynitride.

The first via hole 74 is disposed in the passivation layer 73 and the interlayer dielectric layer 72, and exposes a portion of the second gate 21.

The second via hole 75 is disposed in the passivation layer 73 and the interlayer dielectric layer 72, and exposes a portion of the gate insulating layer 71.

The conductive layer covers a portion of the passivation layer 73 and is filled in the first via hole 74 and the second via hole 75, and the conductive layer is in contact with the second gate electrode 21 through the first via hole 74.

The conductive hole 77 is disposed in the conductive layer and located in the second via hole 75, wherein the piezoelectric film 1 is formed in the conductive hole 77 and electrically connected to the second gate 21 through the conductive layer.

When the pixel structure is subjected to a vertical pressure, it does not deform substantially, so it does not affect the resolution of the pixel structure much, then it is not necessary to lighten the compensation sub-pixel unit. However, when the pixel structure is subjected to a lateral pressure, it will deform notably, so it may decrease the resolution of the pixel structure. In order to keep the resolution of the pixel structure unchanged, the present disclosure lightens the compensation sub-pixel unit. In this arrangement, by disposing the piezoelectric film 1 in the conductive hole 77, the piezoelectric film 1 may be sensitive to the lateral pressure, and less sensitive to the vertical pressure, so as to ensure that the compensation sub-pixel unit emits light when subjected to a lateral pressure and does not emit light when subjected to a vertical pressure, thus reducing power consumption when it is not deformed.

Optionally, as shown in FIG. 6 to FIG. 11, the conductive layer mentioned above may include a metal conductive layer 760 and a transparent conductive layer 761, and the metal conductive layer 760 may be in contact with the second gate 21 through the first via hole 74. The transparent conductive layer 761 may be an ITO (Indium Tin Oxide) layer, the transparent conductive layer 761 may be electrically connected to the metal conductive layer 760 and filled in the second via hole 75, and a conductive hole 77 is disposed in the transparent conductive layer 761. Such design ensures light transmittance of the conductive layer as well as ensures electrical connection stability between the piezoelectric film 1 and the second gate 21.

As shown in FIG. 8 to FIG. 11, the compensation sub-pixel unit of the arrangement may further include a flat layer 78, an anode layer 79, a pixel definition layer (PDL) 80, an organic light emitting layer 81 and a cathode layer 82.

The flat layer 78 may cover the passivation layer 73, the conductive layer and the piezoelectric film 1. The material of the flat layer 78 may be organic material such as acrylic resin or epoxy resin.

The anode layer 79 may cover a portion of the flat layer 78 and sequentially pass through the flat layer 78 and the passivation layer 73 and be contact with the first drain 33. The material of the anode layer 79 may be one or more of metal aluminum, metal copper, metal molybdenum.

The pixel definition layer 80 may cover the flat layer 78 and the anode layer 79. The material of the pixel definition layer 80 may be organic material such as fluorinated polyimide, fluorinated polymethyl methacrylate or polysiloxane.

The organic light emitting layer 81 may be disposed in the pixel definition layer 80 and in contact with the anode layer 79.

The cathode layer 82 may cover the pixel definition layer 80 and the organic light emitting layer 81 and be in contact with the organic light emitting layer 81. The material of the cathode layer 82 may be transparent material having conductivity, for example, may be Indium Tin Oxide (ITO).

In this arrangement, when the piezoelectric film 1 is deformed and produces a control voltage signal, the switching transistor 2 may transmit the data voltage signal provided by the data voltage signal end 4 to the first source 32 (that is, the first end of the driving transistor 3) under the action of the voltage control signal, thus when the driving transistor 3 is in an on state, it may drive the organic light emitting layer 81 to emit light, that is, lighten the compensation sub-pixel unit.

For example, a touch circuit (not shown in the figure) may further be formed on the cathode layer 82, and the touch circuit will not be affected by the compensation sub-pixel unit.

An arrangement of the present disclosure further provides a method of driving the compensation sub-pixel unit, the method of driving the compensation sub-pixel unit is applied to the compensation sub-pixel unit shown in FIG. 1, and the driving method may include:

when the piezoelectric film 1 is deformed to generate a voltage control signal, transmitting, by the switching transistor 2, the data voltage signal provided by the data voltage signal end 4 to the first end of the driving transistor 3 under the action of the voltage control signal, thus when the driving transistor 3 is in an on state, it can drive the compensation sub-pixel unit to emit light.

When the piezoelectric film 1 is not deformed, the switching transistor 2 is in a non-conduction state.

It should be understood that the foregoing arrangements of the structure of the compensation sub-pixel unit may be referred to understand the technical effect produced by this arrangement, and details of which are not repeatedly described here.

The present disclosure further provides a method of fabricating a compensation sub-pixel unit. As shown in FIG. 12, the fabricating method may include block S100 and block 102.

In block S100, the switching transistor 2 and the driving transistor 3 are formed, the first end of the switching transistor 2 is connected to the data voltage signal end 4, the second end of the switching transistor 2 is connected to the first end of the driving transistor 3, and the control end of the driving transistor 3 is connected to the gate voltage signal end 5, and the second end of the driving transistor 3 is connected to the organic light emitting layer and the power signal end 6.

In block S102, the piezoelectric film 1 is formed, which is connected to the control end of the switching transistor 2, as shown in FIG. 1 and FIGS. 7-11.

In summary, the method of fabricating the compensation sub-pixel unit in the arrangement of the present disclosure, by connecting the piezoelectric film 1 to the control end of the switching transistor 2 to make the switching transistor 2 be turned on when the piezoelectric film 1 is deformed, thus, when the driving transistor 3 is in a on state, it may drive the compensation sub-pixel unit to normally emit light to compensate the pixel resolution of the deformed display panel, that is, to keep the pixel resolution of the display panel unchanged during deformation. In addition, the switching transistor 2 is in a non-conducting state when the piezoelectric film 1 is not deformed, so that the driving transistor 3 may not drive the compensation sub-pixel unit to emit light, which may reduce power consumption of the display panel when it is not deformed.

For example, forming the switching transistor 2 and the driving transistor 3 may include:

forming the switching transistor 2 and the driving transistor 3 on the same side of the substrate 70, wherein, as shown in FIG. 3 to FIG. 11, the driving transistor 3 may include the first active layer 30, the first gate 31, the first source 32 and the first drain 33, the first gate 31 may be formed as the control end of the driving transistor 3, the first source 32 may be formed as the first end of the driving transistor 3, and the first drain 33 may be formed as the second end of the driving transistor 3, and the switching transistor 2 may include the second active layer 20, the second gate 21, the second source 22 and the second drain 23, the second gate 21 may be formed as the control end of the switching transistor 2, the second source 22 may be formed as the first end of the switching transistor 2, and the second drain 23 may be formed as the second end of the switching transistor 2.

In summary, the driving transistor 3 and the switching transistor 2 may be formed on the same side of the substrate 70, so as to reduce processing difficulty of the compensation sub-pixel unit.

Figure 13:
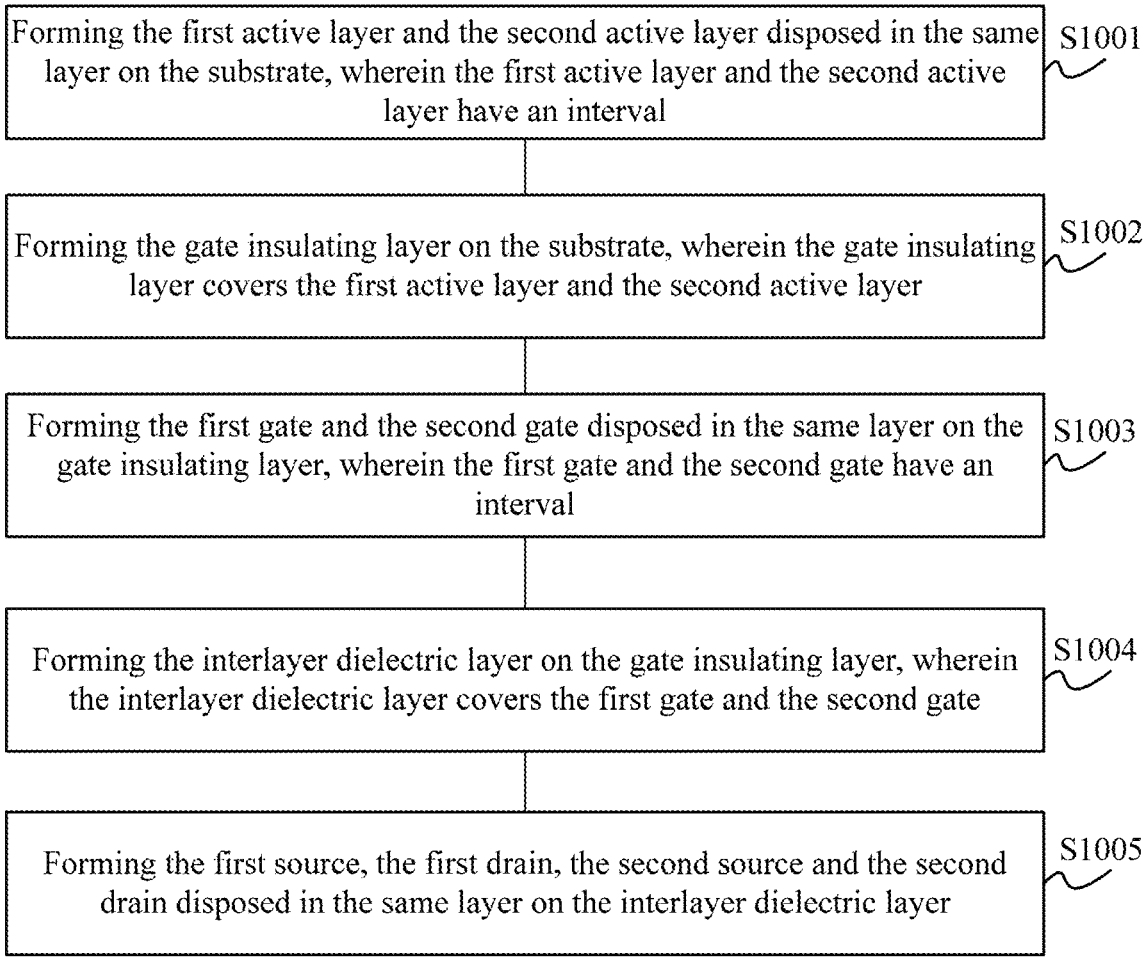
FIG. 13 is a schematic flowchart of block S100 in FIG. 12.

In the arrangement of the present disclosure, forming the switching transistor 2 and the driving transistor 3 on the same side of the substrate 70, as shown in FIG. 13, may include the following blocks.

In block S1001, the first active layer 30 and the second active layer 20 are formed in the same layer on the substrate 70, and the first active layer 30 and the second active layer 20 have an interval.

For example, an amorphous silicon layer may be formed on the substrate 70 by any one of various manners such as deposition, coating, sputtering, etc. After performing laser annealing on the substrate 70 on which the amorphous silicon layer is formed, the amorphous silicon layer may be converted into a polysilicon layer. Then one patterning process is performed on the polysilicon layer to form the first active layer 30 and the second source layer 20, and the one patterning process may include: photoresist coating, exposure, development, etching, and photoresist stripping.

In block S1002, the gate insulating layer 71 is formed on the substrate 70, and the gate insulating layer 71 covers the first active layer 30 and the second active layer 20.

For example, the gate insulating layer 71 may be formed on the substrate 70, on which the first active layer 30 and the second active layer 20 are formed, by any one of various manners such as deposition, coating, sputtering, and the like.

In block S1003, the first gate 31 and the second gate 21 are formed in the same layer on the gate insulating layer 71, and the first gate 31 and the second gate 21 have an interval.

For example, a gate film may be formed on the gate insulating layer 71 by any one of various manners such as deposition, coating, sputtering, and the like. Then one patterning process is performed on the gate film to form the first gate 31 and the second gate 21, and the one patterning process may include: photoresist coating, exposure, development, etching, and photoresist stripping.

In block S1004, the interlayer dielectric layer 72 is formed on the gate insulating layer 71, and the interlayer dielectric layer 72 covers the first gate 31 and the second gate 21.

For example, the interlayer dielectric layer 72 may be formed on the gate insulating layer 71, on which the first gate 31 and the second gate 21 are formed, by any one of various manners such as deposition, coating, sputtering, and the like. Then one patterning process is performed on the interlayer dielectric layer 72 and the gate insulating layer 71 to form a first matching hole 83, a second matching hole 84, a third matching hole 85 and a fourth matching hole 86 penetrating the interlayer dielectric layer 72 and the gate insulating layer 71. The first matching hole 83 and the second matching hole 84 expose a portion of the first active layer 30, and the third matching hole 85 and the fourth matching hole 86 expose a portion of the second active layer 20, as shown in the FIG. 2. The one patterning process may include: photoresist coating, exposure, development, etching, and photoresist stripping.

In block S1005, the first source 32, the first drain 33, the second source 22 and the second drain 23 are formed in the same layer on the interlayer dielectric layer 72. The first drain 33 and the first source 32 have an interval, and the first drain 33 and the first source 32 sequentially pass through the interlayer dielectric layer 72 and the gate insulating layer 71 and are in contact with the first active layer 30. The second drain 23 is connected to the first source 32 and has an interval with the second source 22, and the second source 22 and the second drain 23 sequentially pass through the interlayer dielectric layer 72 and the gate insulating layer 71 and in contact with the second active layer 20.

For example, a conductive film may be formed on the interlayer dielectric layer 72 by any one of various manners such as deposition, coating, sputtering, etc. Then one patterning process is performed on the conductive film to form the first source 32, the drain 33, the second source 22 and the second drain 23. The first source 32 and the first drain 33 are respectively in contact with both sides of the first active layer 30 through the first matching hole 83 and the second matching hole 84. The second source 22 and the second drain 23 are respectively in contact with both sides of the second active layer 20 through the third matching hole 85 and the fourth matching hole 86. The one patterning process may include: photoresist coating, exposure, development, etching, and photoresist stripping.

It should be noted that, after the interlayer dielectric layer 72 is formed, a conductive treatment may be performed on both sides of the first active layer 30 and the second active layer 20 by a doping process. Then the block S1005 is performed, to make the first drain 33 and the first source 32 are respectively contact with both sides of the first active layer 30, and make the second drain 23 and the second source 22 are respectively in contact with both sides of the second active layer 20.

Figure 14:
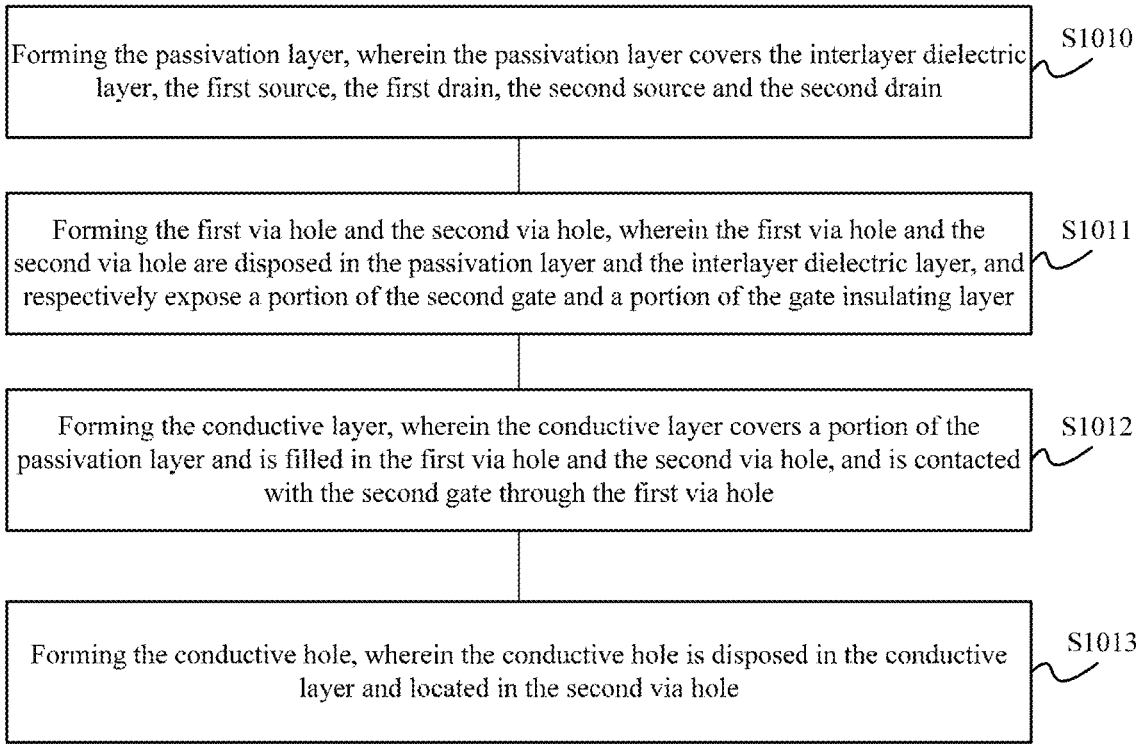
FIG. 14 is a partial schematic flowchart of a method of fabricating a compensation sub-pixel unit according to another arrangement of the present disclosure.

In this arrangement, after forming the switching transistor 2 and the driving transistor 3, and before forming the piezoelectric film 1, as shown in FIG. 14, the method of fabricating the compensation sub-pixel unit may further include the following blocks.

Figure 3:
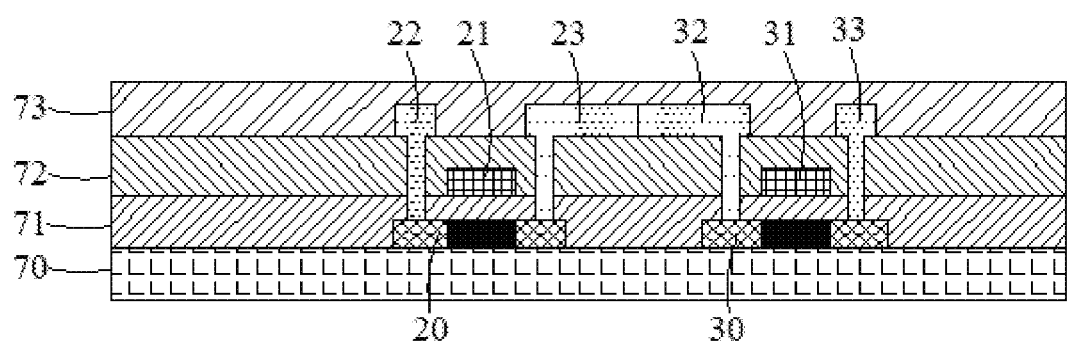

In block S1010, the passivation layer 73 is formed, and the passivation layer 73 covers the interlayer dielectric layer 72, the first source 32, the first drain 33, the second source 22 and the second drain 23, as shown in FIG. 3.

For example, the passivation layer 73 is formed on the interlayer dielectric layer 72, on which the first source 32, the first drain 33, the second source 22 and the second drain 23 are formed, by any one of various manners such as deposition, coating, sputtering, etc.

Figure 4:
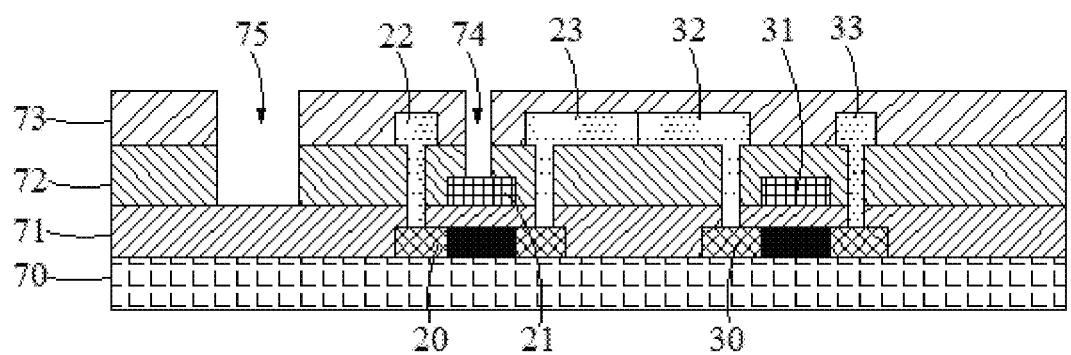

In block S1011, the first via hole 74 and the second via hole 75 are formed, the first via hole 74 and the second via hole 75 are disposed in the passivation layer 73 and the interlayer dielectric layer 72 and respectively expose a portion of the second gate 21 and expose a portion of the gate insulating layer 71, as shown in FIG. 4.

For example, since the depth of the second via hole 75 is greater than the depth of the first via hole 74, it is necessary to perform two patterning processes on the substrate 70, on which the passivation layer 73 is formed, to respectively form the first via hole 74 and the second via hole 75, so as to avoid excessive etching of the first via hole 74 or insufficient etching of the second via hole 75. Both the two patterning processes may include: photoresist coating, exposure, development, etching, and photoresist stripping.

In block S1012, the conductive layer is formed, the conductive layer covers a portion of the passivation layer 73 and is filled in the first via hole 74 and the second via hole 75, and the conductive layer is in contact with the second gate electrode 21 through the first via hole 74, to realize an electrical connection between the conductive layer and the second gate 21.

Figure 6:
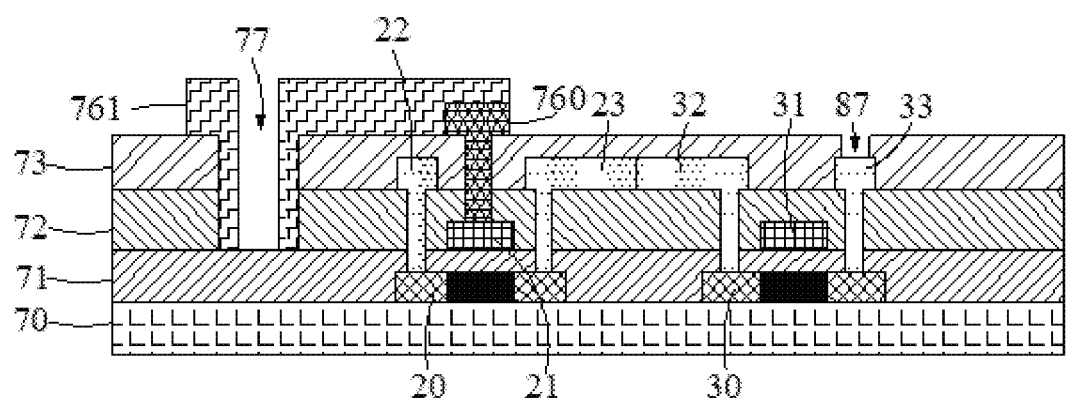

In block S1013, the conductive hole 77 is formed, and the conductive hole 77 is disposed in the conductive layer and located in the second via hole 75, as shown in FIG. 6.

For example, one patterning process is performed on a portion of the conductive layer to form the conductive hole 77, and the one patterning process may include: photoresist coating, exposure, development, etching, and photoresist stripping.

Figure 7:
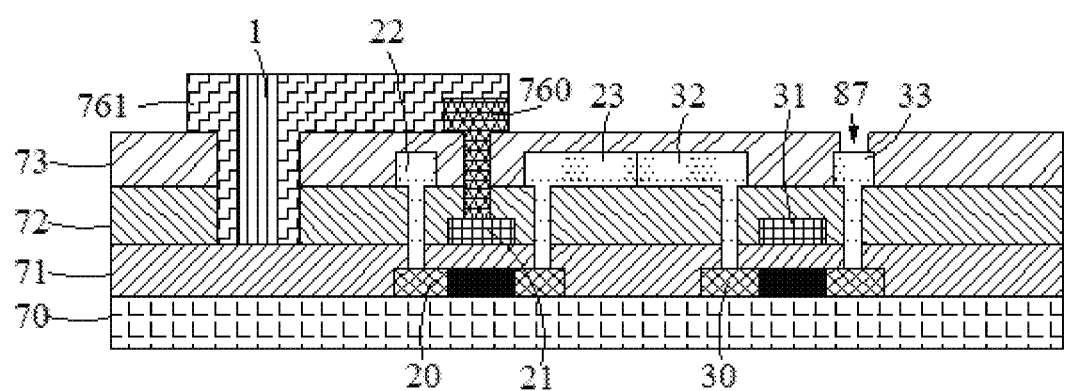

As shown in FIG. 7, the piezoelectric film 1 may be formed in the conductive hole 77, and the piezoelectric film 1 is electrically connected to the second gate 21 through the conductive layer. That is, after block S1013 is performed, block S102 may be performed, that is, the piezoelectric film 1 is formed, which is deposited in the conductive hole 77 and is in contact with the conductive layer, therefore, it may be electrically connected to the second gate 21 through the conductive layer.

For example, as shown in FIG. 15, forming the conductive, includes block S10121 and block S10122.

Figure 5:
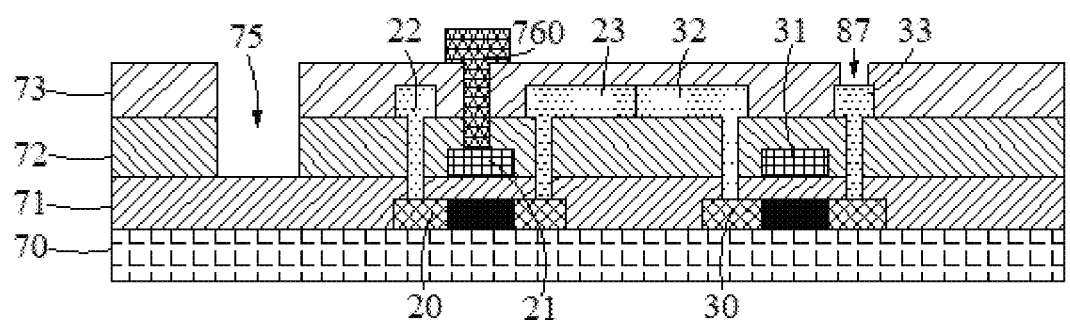

In block S10121, a metal conductive layer 760 is formed, which is in contact with the second gate 21 through the first via hole 74, as shown in FIG. 5.

For example, the metal conductive layer 760 may be formed in a portion of the passivation layer 73 and the first via hole by any one of various manners such as deposition, coating, sputtering, and the like.

It should be understood that, after the block S10121 is performed, one patterning process may be performed on the passivation layer 73 to form a fifth matching hole 87 penetrating the passivation layer 73, and the fifth matching hole 87 exposes a portion of the first drain 33.

In block S10122, a transparent conductive layer 761 is formed, which is electrically connected to the metal conductive layer 760 and filled in the second via hole 75.

For example, the transparent conductive layer 761 may be formed in a portion of the passivation layer 73, the metal conductive layer 760, and the second via hole by any of various manners such as deposition, coating, sputtering, and the like.

After block S10122 is performed, block S1013 may be performed.

For example, one patterning process may be performed on the transparent conductive layer 761 to form the conductive hole 77. As shown in FIG. 6, the one patterning process may include: photoresist coating, exposure, development, etching, and photoresist stripping.

For example, in another arrangement, before the passivation layer 73 is formed, the interlayer dielectric layer 72 may be etched to form two via holes. Then the passivation layer 73 is formed, and then portions of the passivation layer 73 corresponding to the two via holes are etched to form the first via hole 74 and the second via hole 75.

Figure 16:
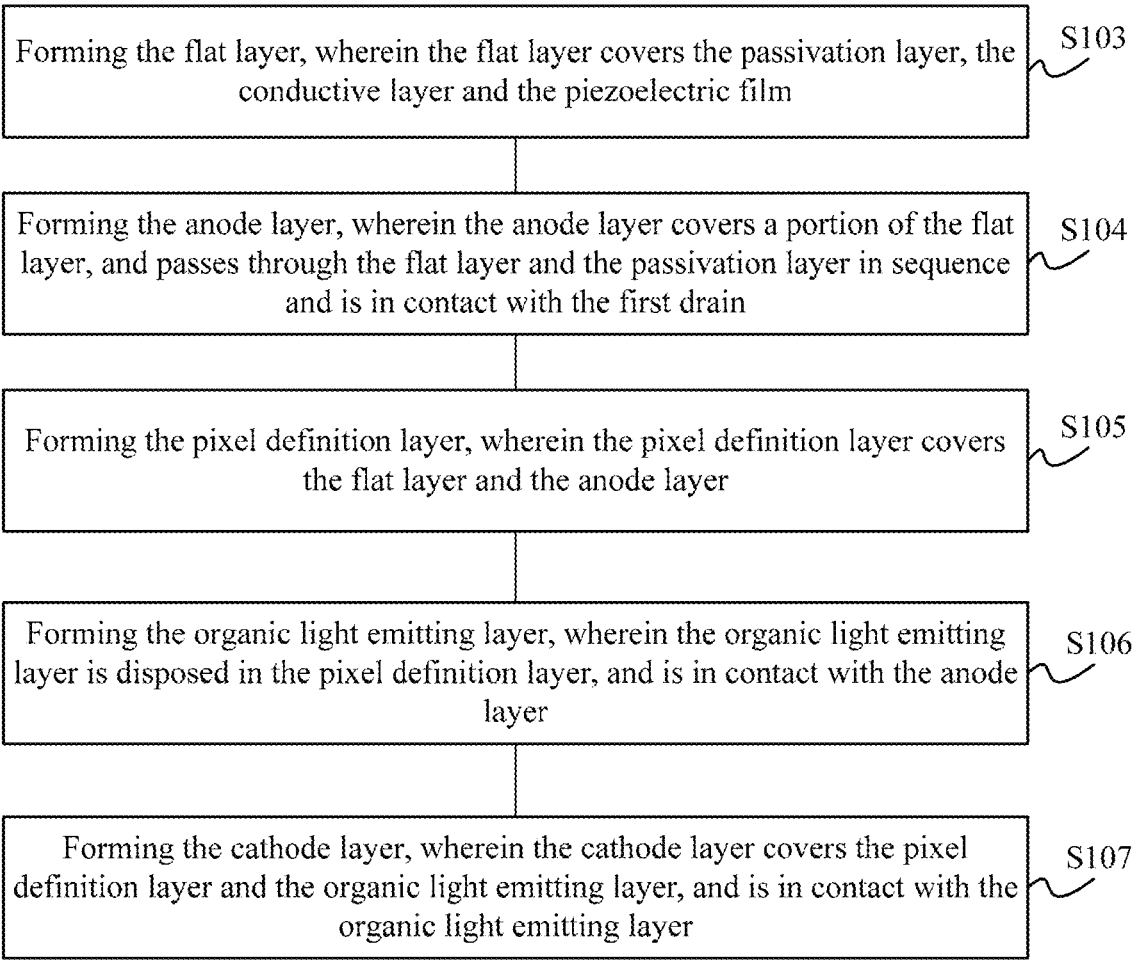
FIG. 16 is a partial schematic flowchart of a method of fabricating a compensation sub-pixel unit according to another arrangement of the present disclosure.

After the piezoelectric film 1 is formed, as shown in FIG. 16, the method of fabricating the compensation sub-pixel unit may further include the following blocks.

In block S103, the flat layer 78 is formed, which covers the passivation layer 73, the conductive layer and the piezoelectric film 1.

Figure 8:
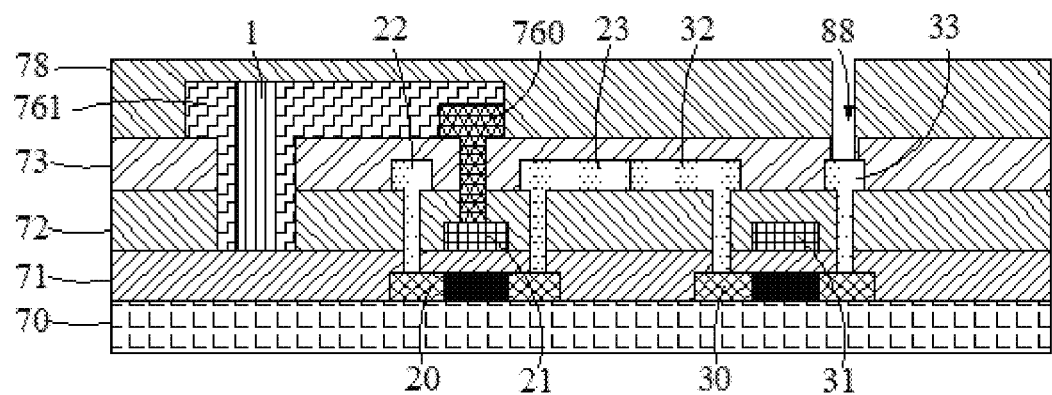

For example, the flat layer 78 may be formed on the passivation layer 73, on which the conductive layer and the piezoelectric film 1 are formed, by any one of various method such as deposition, coating, sputtering, and the like. Then one patterning process is performed on the flat layer 78 to form the sixth mating hole 88 penetrating the flat layer 78, and the sixth mating hole 88 exposes a portion of the first drain 33, as shown in FIG. 8. The one patterning process may include: photoresist coating, exposure, development, etching, and photoresist stripping.

In block S104, the anode layer 79 is formed, and the anode layer 79 covers a portion of the flat layer 78, and sequentially passes through the flat layer 78 and the passivation layer 73 and in contact with the first drain 33.

Figure 9:
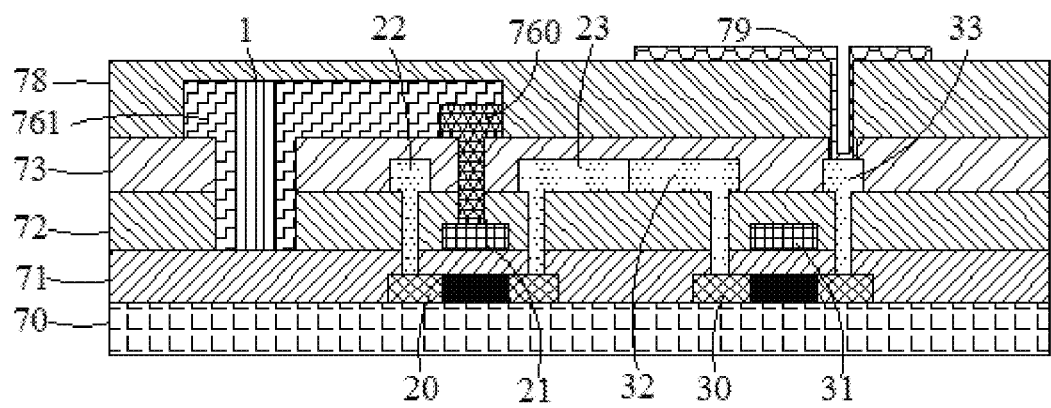

For example, the anode layer 79 may be formed on a portion of the flat layer 78 by any one of various manners such as deposition, coating, sputtering, etc., and the anode layer 79 may be in contact with the first drain electrode 33 through the sixth matching hole 88, as shown in FIG. 9.

In block S105, the pixel definition layer 80 is formed, which covers the flat layer 78 and the anode layer 79.

Figure 10:
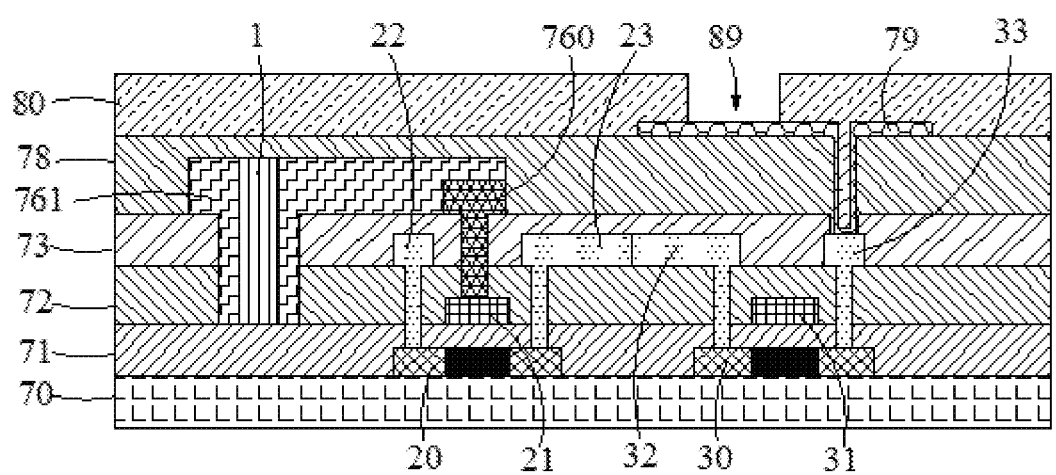

For example, the pixel definition layer 80 may be formed on the flat layer 78, on which the anode layer 79 are formed, by any of various manners such as deposition, coating, sputtering, etc. Then one patterning process is performed on the pixel definition layer 80 to form the seventh matching hole 89 penetrating the pixel definition layer 80, and the seventh matching hole 89 exposes a portion of the anode layer 79, as shown in FIG. 10. The one patterning process may include: photoresist coating, exposure, development, etching, and photoresist stripping.

In block S106, the organic light emitting layer 81 is formed, which is disposed in the pixel defining layer 80 and is in contact with the anode layer 79.

For example, the organic light emitting layer 81 may be formed in the seventh matching hole 89 by an inkjet printing technique, and the organic light emitting layer 81 is in contact with the anode layer 79.

Figure 11:
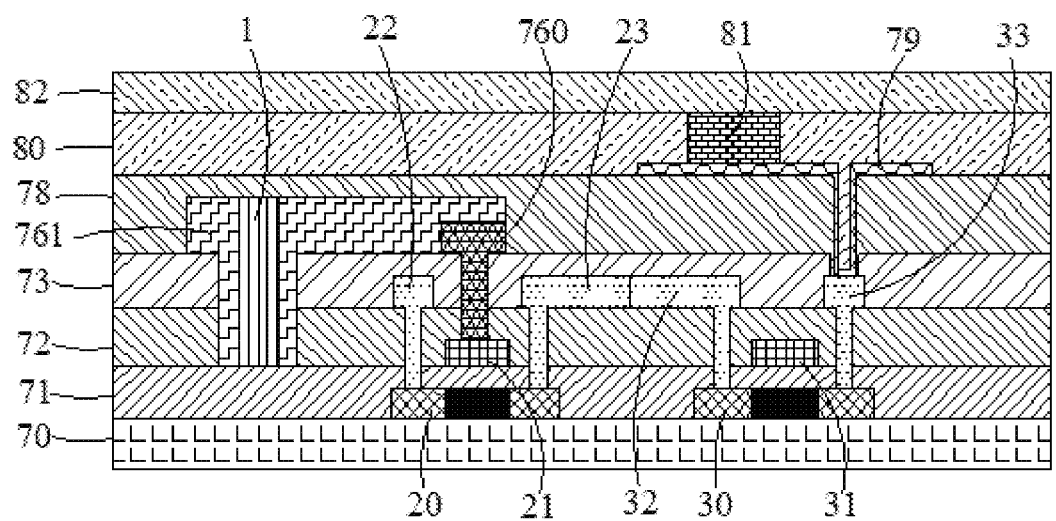

In block S107, the cathode layer 82 is formed, which covers the pixel definition layer 80 and the organic light emitting layer 81, and is in contact with the organic light emitting layer 81, as shown in FIG. 11.

For example, the cathode layer 82 may be plated on the pixel definition layer 80 and the organic light emitting layer 81 by evaporation.

The arrangement of the present disclosure further provides a pixel structure, and the pixel structure may have certain flexibility and may be applied to a flexible display panel. The pixel structure may include a plurality of pixel units, each of which includes a display sub-pixel unit and the compensation sub-pixel unit described in any of the above arrangements. The shape of the display sub-pixel unit and the compensation sub-pixel unit includes one or more of a rectangle, a diamond, a circle, an ellipse and a triangle.

In an arrangement, the pixel unit may include a first sub-pixel group and a second sub-pixel group, the first sub-pixel group includes a first display sub-pixel unit, a second compensation sub-pixel unit and a third display sub-pixel unit that have the same area and are disposed in sequence in the same column, and the second sub-pixel group includes a first compensation sub-pixel unit, a second display sub-pixel unit and a third compensation sub-pixel unit that have the same area and are disposed in sequence in the same column. The first display sub-pixel unit and the first compensation sub-pixel unit are disposed in the same row, the second display sub-pixel and the second compensation sub-pixel unit are disposed in the same row, and the third display sub-pixel unit and the third compensation sub-pixel unit are disposed in the same row. The first display sub-pixel unit, the second display sub-pixel unit and the third display sub-pixel unit are all the display sub-pixel units, and the first compensation sub-pixel unit, the second compensation sub-pixel unit and the third compensation sub-pixel unit are all the compensation sub-pixel units.

Figure 17:
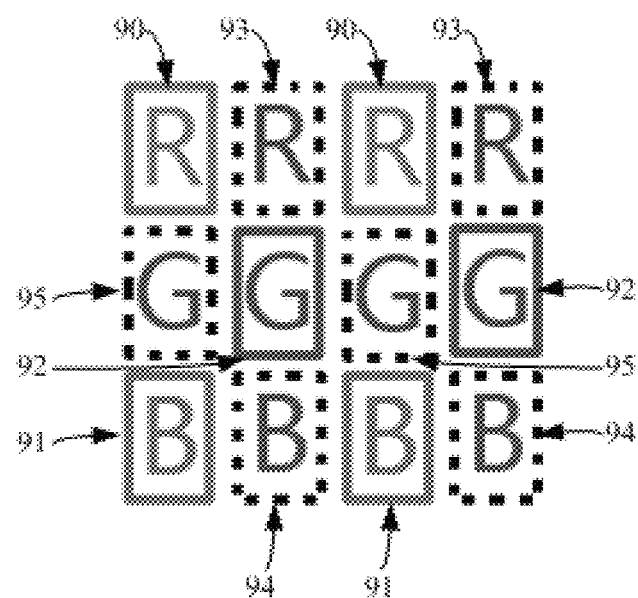
FIG. 17 and FIG. 18 are schematic diagrams of the arrangement of the respective display sub-pixel units and the respective compensation sub-pixel units when the pixel structure is in different cases according to an arrangement of the present disclosure.
Figure 18:
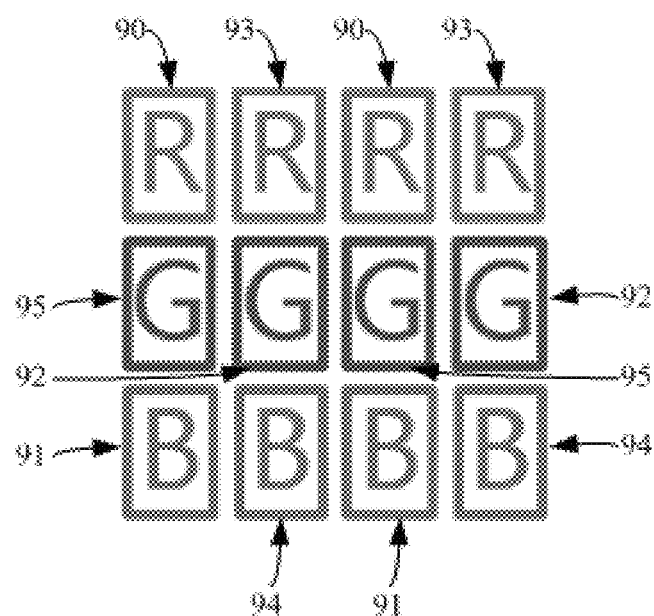

For example, as shown in FIG. 17 and FIG. 18, the first display sub-pixel unit may be a red display sub-pixel unit 90, the third display sub-pixel unit may be a blue display sub-pixel unit 91, and the second display sub-pixel unit may be a green display sub-pixel unit 92. The first compensation sub-pixel unit is a red compensation sub-pixel unit 93, the third compensation sub-pixel unit is a blue compensation sub-pixel unit 94, and the second compensation sub-pixel unit is a green compensation sub-pixel unit 95. The shape of the first display sub-pixel unit, the second display sub-pixel unit, the third display sub-pixel unit, the first compensation sub-pixel unit, the second compensation sub-pixel unit and the third compensation sub-pixel unit may be a rectangle, as shown in FIG. 17 and FIG. 18, but not limited to a rectangle, and may be other shape such as a circle, an ellipse, a diamond, etc.

As shown in FIG. 17, when the pixel structure is not deformed, that is, the AMOLED display is not deformed, the red display sub-pixel unit 90, the blue display sub-pixel unit 91 and the green display sub-pixel unit 92 normally emit light, and the red compensation sub-pixel unit 93, the blue compensation sub-pixel unit 94 and the green compensation sub-pixel unit 95 do not emit light, so as to reduce power consumption of the pixel structure when it is not deformed. As shown in FIG. 18, when the pixel structure is deformed, that is, the AMOLED display is deformed, the red display sub-pixel unit 90, the blue display sub-pixel unit 91 and the green display sub-pixel unit 92 normally emit light, and the red compensation sub-pixel unit 93, the blue compensation sub-pixel unit 94 and the green compensation sub-pixel unit 95 emit light (that is, normally emit light) to compensate the pixel resolution of the deformed pixel structure, that is, the pixel resolution of the pixel structure keeps unchanged during deformation.

Figure 19:
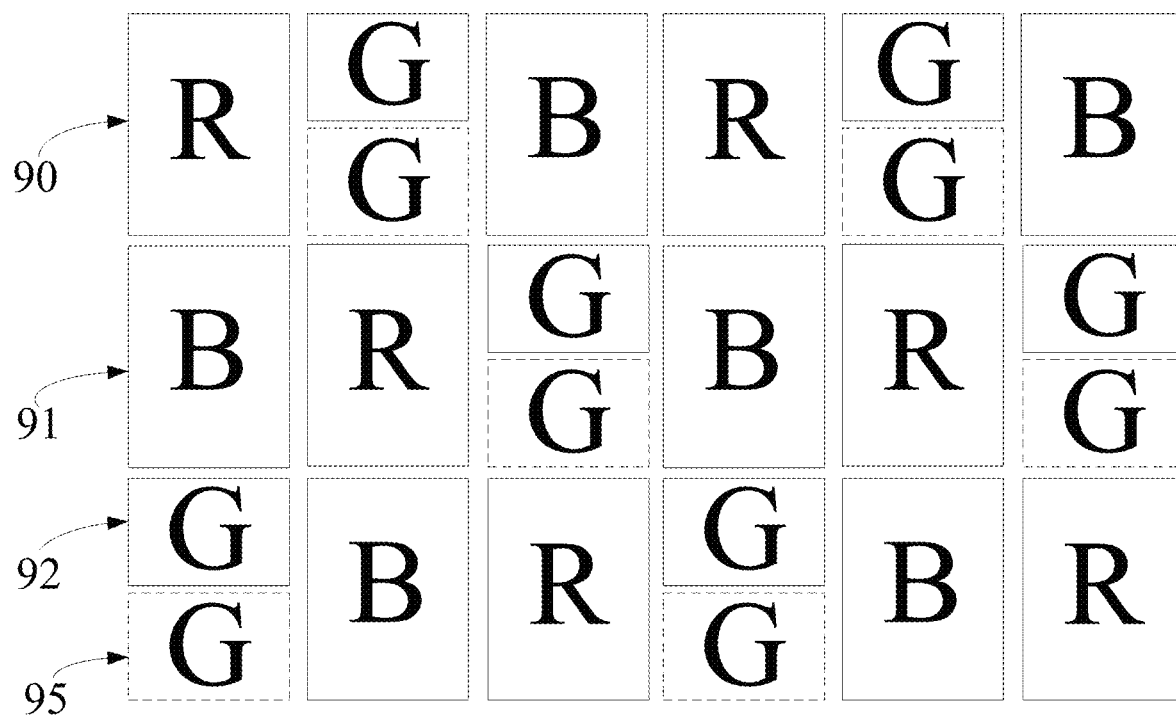
FIG. 19 and FIG. 20 are schematic diagrams of the arrangement of the respective display sub-pixel units and the respective compensation sub-pixel units when the pixel structure is in different cases according to another arrangement of the present disclosure.
Figure 20:
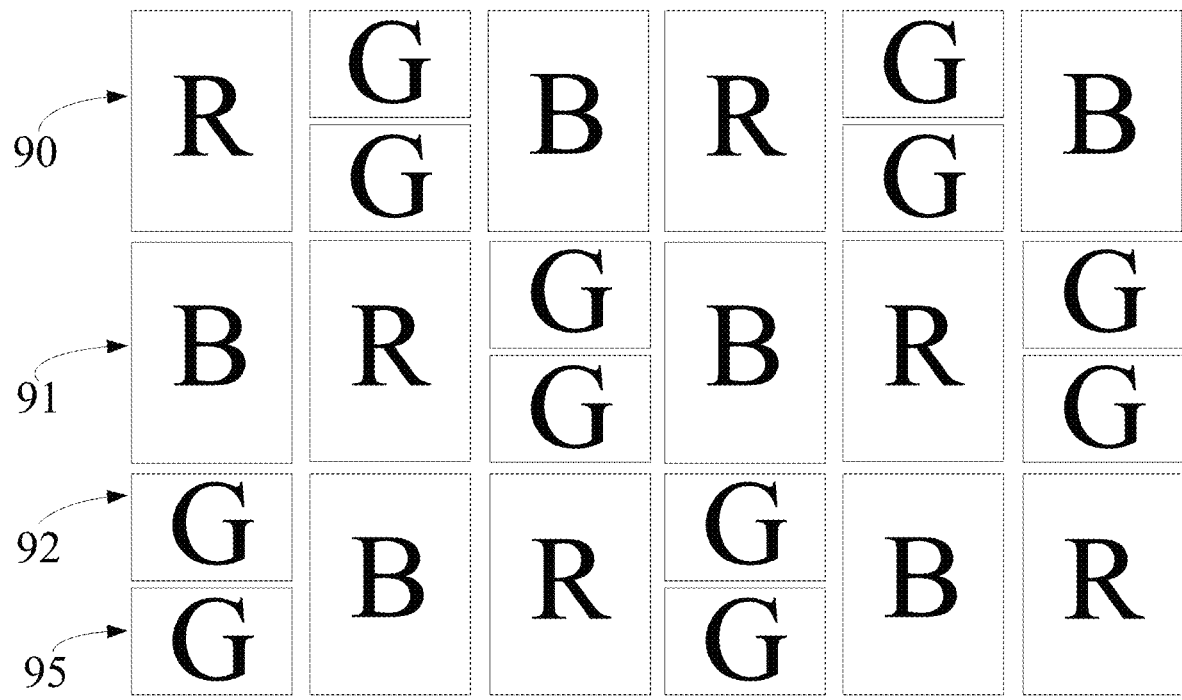

In another arrangement, as shown in FIG. 19 and FIG. 20, the pixel unit includes a first sub-pixel group, a second sub-pixel group and a third sub-pixel group. Each of the first sub-pixel group, the second sub-pixel group and the third sub-pixel group includes a first sub-pixel unit, a second sub-pixel unit and a third sub-pixel unit that have the same area and are disposed in sequence in the same column. The first sub-pixel unit and the second sub-pixel unit are the display sub-pixel units, and the third sub-pixel unit includes the display sub-pixel unit and the compensation sub-pixel unit that have the same area and are disposed in the same column. The first sub-pixel unit in the first sub-pixel group, the third sub-pixel unit in the second sub-pixel group, and the second sub-pixel unit in the third sub-pixel group are disposed in sequence in the same row. The second sub-pixel unit in the first sub-pixel group, the first sub-pixel unit in the second sub-pixel group, and the third sub-pixel unit in the third sub-pixel group are disposed in sequence in the same row. The third sub-pixel unit in the first sub-pixel group, the second sub-pixel unit in the second sub-pixel group, and the first sub-pixel unit in the third sub-pixel group are disposed in sequence in the same row.

For example, as shown in FIG. 19 and FIG. 20, the first sub-pixel unit may be the red display sub-pixel unit 90, the second sub-pixel unit may be the blue display sub-pixel unit 91, and the third sub-pixel unit may include the green display sub-pixel unit 92 and the green compensation sub-pixel unit 95. The shape of the first sub-pixel unit, the second sub-pixel unit and the third sub-pixel unit may be a rectangle as shown in FIG. 19 and FIG. 20, but is not limited to a rectangle, and may be other shape such as a circle, an ellipse, a diamond, etc., depending on specific conditions.

As shown in FIG. 19, when the pixel structure is not deformed, that is, the AMOLED display is not deformed, the red display sub-pixel unit 90, the blue display sub-pixel unit 91 and the green display sub-pixel unit 92 normally emit light, and green compensation sub-pixel unit 95 does not emit light, so as to reduce power consumption of the pixel structure when it is not deformed. As shown in FIG. 20, when the pixel structure is deformed, that is, the AMOLED display is deformed, the red display sub-pixel unit 90, the blue display sub-pixel unit 91 and the green display sub-pixel unit 92 normally emit light, and the green compensation sub-pixel unit 95 emits light (that is, normally emits light) to compensate the pixel resolution of the deformed pixel structure, that is, the pixel resolution of the pixel structure keeps unchanged during deformation.

Figure 21:
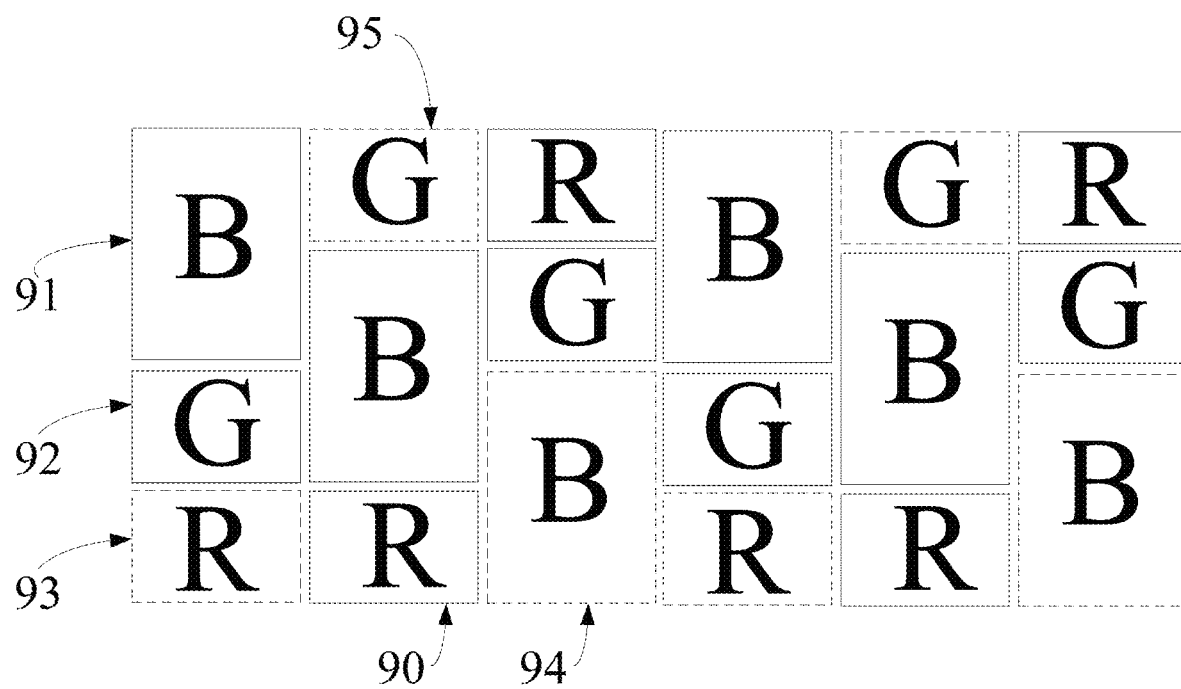
FIG. 21 and FIG. 22 are schematic diagrams of the arrangement of the respective display sub-pixel units and the respective compensation sub-pixel units when the pixel structure is in different cases according to further another arrangement of the present disclosure.
Figure 22:
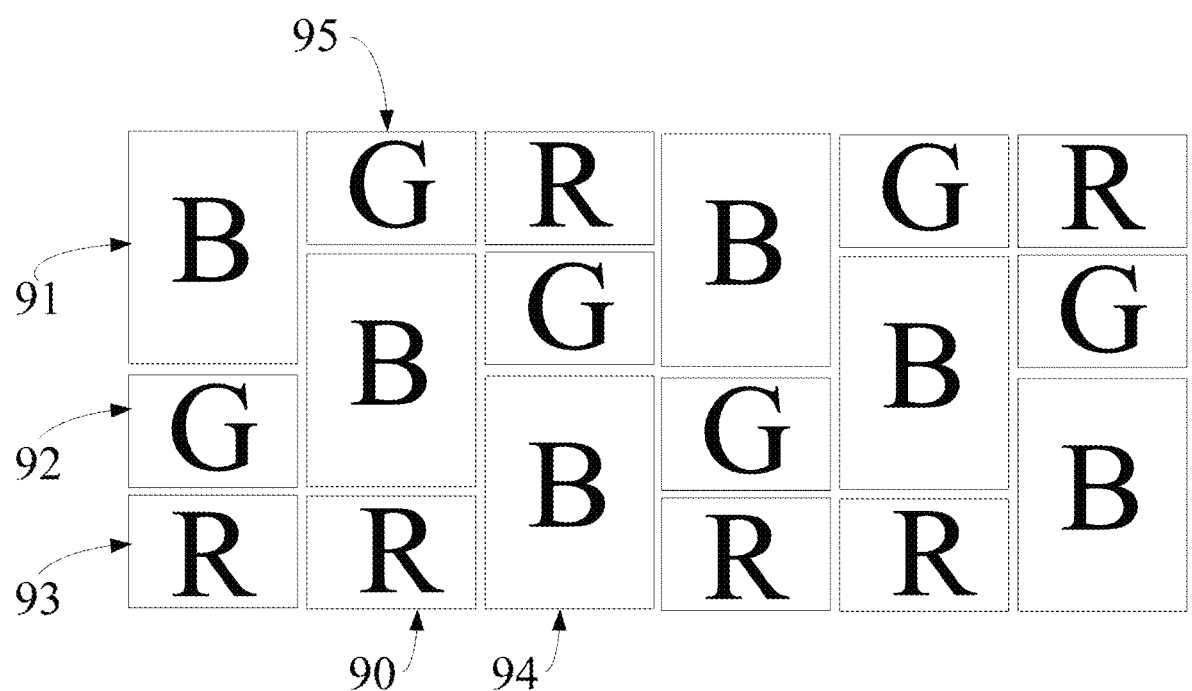

In another arrangement, as shown in FIG. 21 and FIG. 22, the pixel unit includes a first sub-pixel group, a second sub-pixel group and a third sub-pixel group. The first sub-pixel group includes a first display sub-pixel unit, a second display sub-pixel unit and a third compensation sub-pixel unit that are disposed in sequence in the same column, the second sub-pixel group includes a second compensation sub-pixel unit, a first display sub-pixel unit and a third display sub-pixel unit that are disposed in sequence in the same column, and the third sub-pixel group includes a third display sub-pixel unit, a second display sub-pixel unit and a first compensation sub-pixel unit that are disposed in sequence in the same column. The first display sub-pixel unit, the second display sub-pixel unit and the third display sub-pixel unit are all the display sub-pixel units, and areas of both the second display sub-pixel unit and the third display sub-pixel unit are one-half of that of the first display sub-pixel unit. The first compensation sub-pixel unit, the second compensation sub-pixel unit and the third compensation sub-pixel unit are all the compensation sub-pixel units, and areas of both the second compensation sub-pixel unit and the third compensation sub-pixel unit are one-half of that of the first compensation sub-pixel unit. The first display sub-pixel unit has the same area as that of the first compensation sub-pixel unit, the second display sub-pixel unit has the same area as that of the second compensation sub-pixel unit, and the third display sub-pixel unit has the same area as that of the third compensation sub-pixel unit.

For example, as shown in FIG. 21 and FIG. 22, the first display sub-pixel unit may be a blue display sub-pixel unit 91, the second display sub-pixel unit may be a green display sub-pixel unit 92, and the third display sub-pixel unit may be a red display sub-pixel unit 90. The first compensation sub-pixel unit may be a blue compensation sub-pixel unit 94, the second compensation sub-pixel unit may be a green compensation sub-pixel unit 95, and the third compensation sub-pixel unit may be a red compensation sub-pixel unit 93. The shape of the first display sub-pixel unit, the second display sub-pixel unit, the third display sub-pixel unit, the first compensation sub-pixel unit, the second compensation sub-pixel unit, and the third compensation sub-pixel unit may be a rectangle as shown in FIG. 21 and FIG. 22, but not limited to a rectangle, and may be other shape such as a circle, an ellipse, a diamond, etc., depending on specific conditions.

As shown in FIG. 21, when the pixel structure is not deformed, that is, the AMOLED display is not deformed, the red display sub-pixel unit 90, the blue display sub-pixel unit 91 and the green display sub-pixel unit 92 normally emit light, and the red compensation sub-pixel unit 93, the blue compensation sub-pixel unit 94 and the green compensation sub-pixel unit 95 do not emit light, so as to reduce power consumption of the pixel structure when it is not deformed. As shown in FIG. 22, when the pixel structure is deformed, that is, the AMOLED display is deformed, the red display sub-pixel unit 90, the blue display sub-pixel unit 91 and the green display sub-pixel unit 92 normally emit light, and the red compensation sub-pixel unit 93, the blue compensation sub-pixel unit 94 and the green compensation sub-pixel unit 95 emit light (that is, normally emit light) to compensate the pixel resolution of the deformed pixel structure, that is, the pixel resolution of the pixel structure keeps unchanged during deformation.

Figure 23:
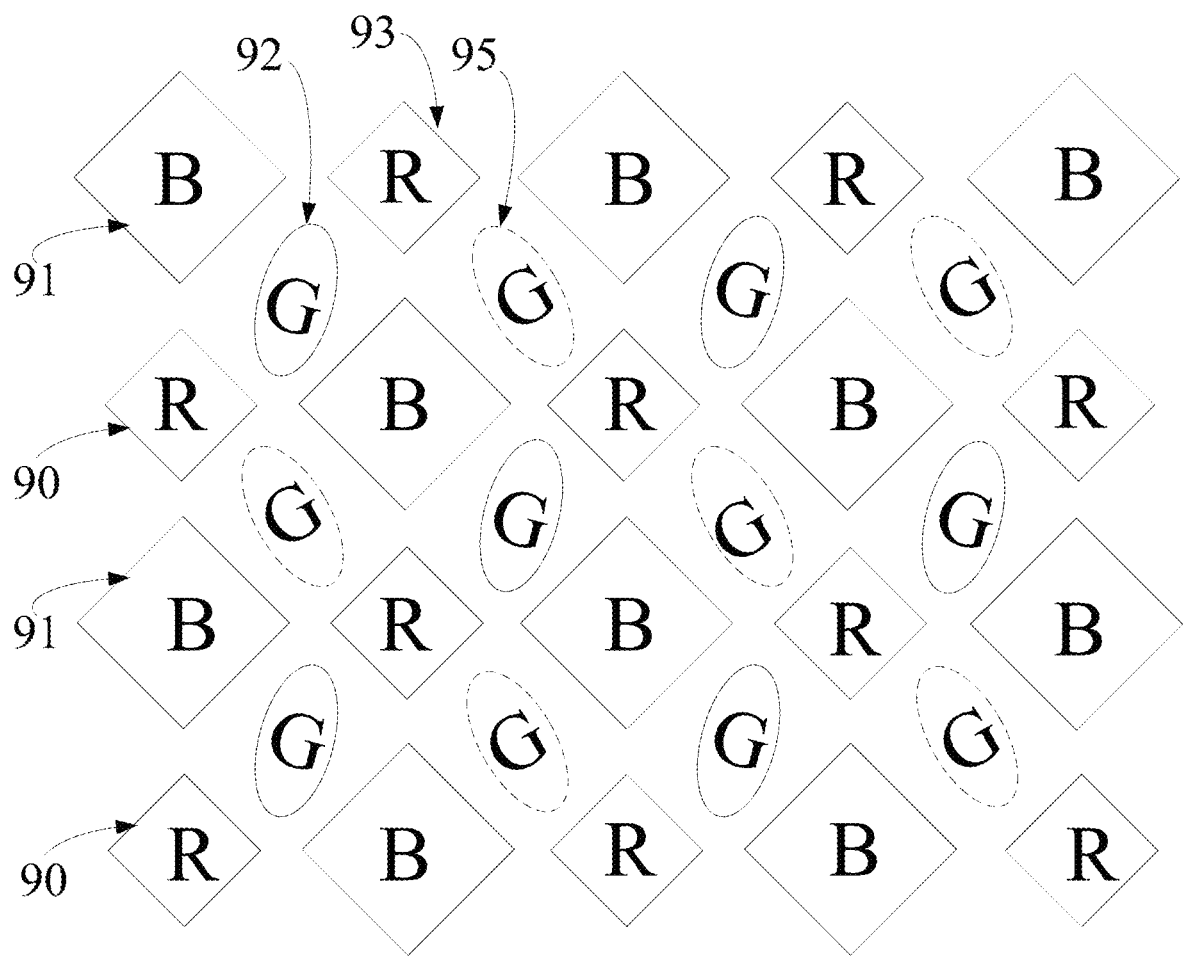
FIG. 23 and FIG. 24 are schematic diagrams of the arrangement of the respective display sub-pixel units and the respective compensation sub-pixel units when the pixel structure is in different cases according to still another arrangement of the present disclosure.
Figure 24:
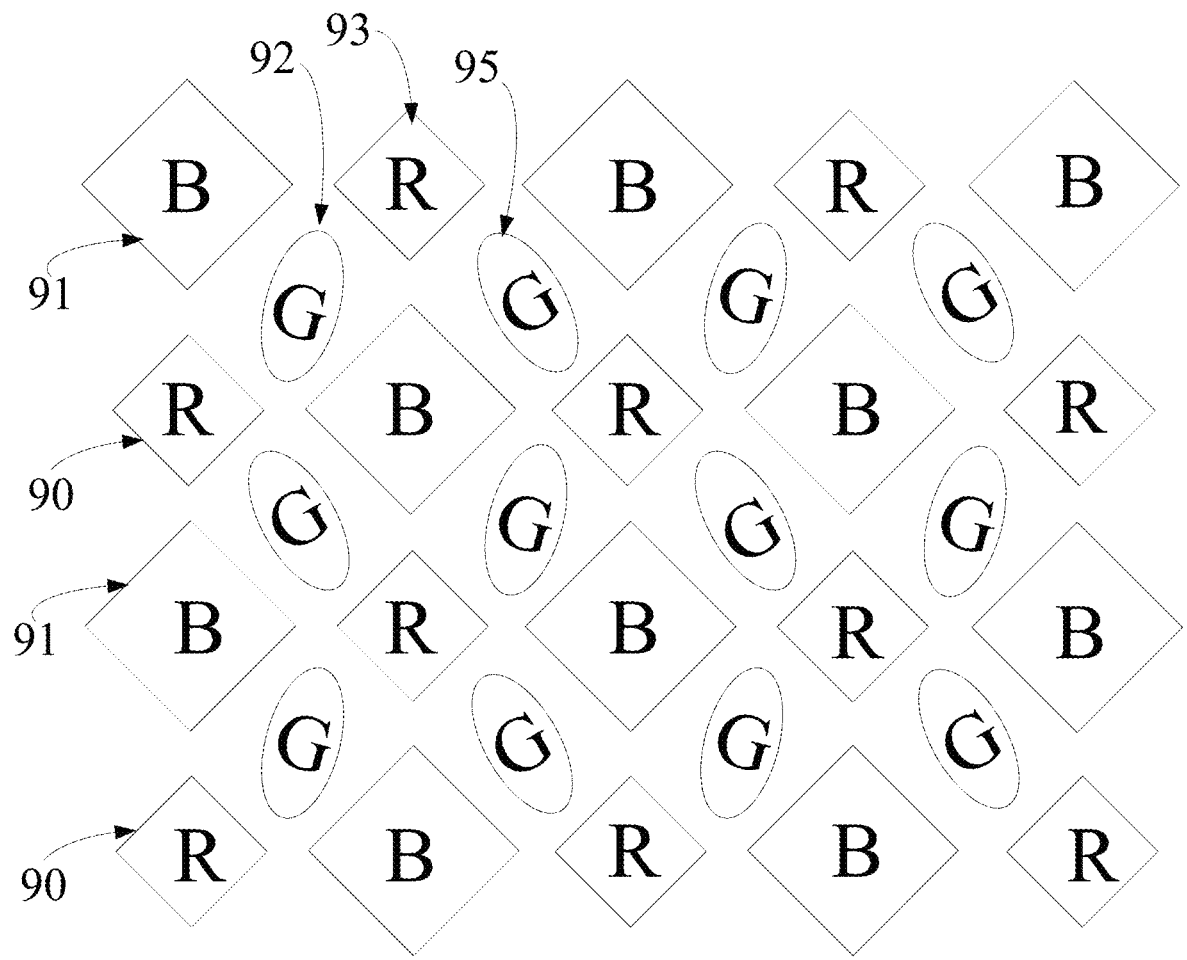

In another arrangement, as shown in FIG. 23 and FIG. 24, the pixel unit includes a first sub-pixel group, a second sub-pixel group, and a third sub-pixel group and a fourth sub-pixel group respectively disposed staggeredly with the first sub-pixel group and the second sub-pixel group. Each of the first sub-pixel group and the second sub-pixel group includes a first display sub-pixel unit and a second display sub-pixel unit that are disposed alternately in the same row, the first display sub-pixel unit and the second display sub-pixel unit are the display sub-pixel units, and an area of the first display sub-pixel unit is larger than that of the second display sub-pixel unit. Each of the third sub-pixel group and the fourth sub-pixel group includes a third display sub-pixel unit and a compensation sub-pixel unit that are alternately disposed in the same row, the third display sub-pixel unit is the display sub-pixel unit, and an area of the compensation sub-pixel unit is the same as that of the third display sub-pixel unit.

The first display sub-pixel unit in the first sub-pixel group and the second display sub-pixel unit in the second sub-pixel group are disposed in the same column. The second display sub-pixel unit in the first sub-pixel group and the first display sub-pixel unit in the second sub-pixel group are disposed in the same column. The third display sub-pixel unit in the third sub-pixel group and the compensation sub-pixel unit in the fourth sub-pixel group are disposed in the same column. The compensation sub-pixel unit in the third sub-pixel group and the third display sub-pixel unit in the fourth sub-pixel group are disposed in the same column. The third display sub-pixel unit and the compensation sub-pixel unit are respectively located among the first display sub-pixel units and the second display sub-pixel units that are adjacent to each other. It should be understood that, in this arrangement, the sum of the numbers of the compensation sub-pixel units and the third display sub-pixel units is greater than the sum of the numbers of the first display sub-pixel units and the second display sub-pixel units. The compensation sub-pixel unit and the third display sub-pixel unit are separately displayed and do not participate in borrowing, that is, the first display sub-pixel unit and the second display sub-pixel unit in one pixel may be shared with other pixels, but the compensation sub-pixel unit and the third display sub-pixel unit do not participate in sharing.

For example, as shown in FIG. 23 and FIG. 24, the first display sub-pixel unit may be a blue display sub-pixel unit 91, the second display sub-pixel unit may be a red display sub-pixel unit 90, the third display sub-pixel unit may be a green display sub-pixel unit 92, and the compensation sub-pixel unit may a green compensation sub-pixel unit 95. The shape of the first display sub-pixel unit and the second display sub-pixel unit may be a diamond as shown in FIG. 23 and FIG. 24, but not limited to a diamond, and may be other shape, such as a circle, an ellipse, a rectangle, etc., depending on specific conditions. The third display sub-pixel unit and the compensation sub-pixel unit may be an ellipse as shown in FIG. 23 and FIG. 24, but not limited to an ellipse, and may be other shape such as a circle, a rectangle, a diamond, etc., depending on specific conditions.

As shown in FIG. 23, when the pixel structure is not deformed, that is, the AMOLED display is not deformed, the red display sub-pixel unit 90, the blue display sub-pixel unit 91 and the green display sub-pixel unit 92 normally emit light, and the green compensation sub-pixel unit 95 does not emit light, so as to reduce power consumption of the pixel structure when it is not deformed. As shown in FIG. 24, when the pixel structure is deformed, that is, the AMOLED display is deformed, the red display sub-pixel unit 90, the blue display sub-pixel unit 91 and the green display sub-pixel unit 92 normally emit light, and the green compensation sub-pixel unit 95 emits light (that is, normally emits light) to compensate the pixel resolution of the deformed pixel structure, that is, the pixel resolution of the pixel structure keeps unchanged during deformation.

In this arrangement, by disposing respective display sub-pixel units in respective display sub-pixel groups and respective compensation sub-pixel units in respective compensation sub-pixel groups alternately, the situation that the respective compensation sub-pixel units interfere with the display effect of the pixel structure when the display panel is not deformed, may be alleviated, thereby improving the display effect.

It should be noted that, in FIG. 17 to FIG. 24, the compensation sub-pixel unit in a dotted line box indicates that the compensation sub-pixel unit does not emit light (that is, no light is emitted); and the compensation sub-pixel unit in a solid line box indicates that the compensation sub-pixel unit emits light, and matches the display sub-pixel unit to form one RGB pixel. In addition, the color of the display sub-pixel unit and the color of the compensation sub-pixel unit are not limited to the three colors mentioned above, and other color may be used, depending on specific conditions.

The arrangement of the present disclose may further provide a display panel, which may be a flexible AMOLED display panel, and the display panel may include the pixel structure described in any of the above arrangements. The display panel may be applied to any product or component having a display function, such as a mobile phone or a tablet computer.

After considering the specification and practicing the disclosure herein, it will be easy for those skilled in the art to think of other arrangements of the present disclosure. The present disclosure intends to cover any variants, usage or adaptation changes of the present disclosure. These variants, usage or adaptation changes follow the general principles of the present disclosure, and include common sense or common technical means in the art not invented by the present disclosure. The specification and arrangement are only exemplary, and the real scope and spirit of the present disclosure are defined by the appended claims.

What is claimed is:

1. A compensation sub-pixel unit, comprising:
a piezoelectric film;
a switching transistor, having a control end connected to the piezoelectric film, and a first end connected to a data voltage signal end; and
a driving transistor, having a control end connected to a gate voltage signal end, a first end connected to a second end of the switching transistor, and a second end connected to a power signal end.

2. The compensation sub-pixel unit according to claim 1, wherein
the compensation sub-pixel unit further comprises a substrate, and the driving transistor and the switching transistor are formed on the same side of the substrate,
the driving transistor comprises a first active layer, a first gate, a first source and a first drain, the first gate is formed as the control end of the driving transistor, the first source is formed as the first end of the driving transistor, and the first drain is formed as the second end of the driving transistor, and
the switching transistor comprises a second active layer, a second gate, a second source and a second drain, the second gate is formed as the control end of the switching transistor, the second source is formed as the first end of the switching transistor, and the second drain is formed as the second end of the switching transistor.

3. The compensation sub-pixel unit according to claim 2, wherein
the first active layer and the second active layer are disposed in the same layer on the substrate, and the first active layer and the second active layer have an interval therebetween,
a gate insulating layer is further formed on the substrate, and the gate insulating layer covers the first active layer and the second active layer,
the first gate and the second gate are disposed in the same layer on the gate insulating layer, and the first gate and the second gate have an interval therebetween,
an interlayer dielectric layer is further formed on the gate insulating layer, and the interlayer dielectric layer covers the first gate and the second gate, and
the first source, the first drain, the second source and the second drain are disposed in the same layer on the interlayer dielectric layer, the first drain and the first source have an interval therebetween, the first drain and the first source pass through the interlayer dielectric layer and the gate insulating layer in sequence and are in contact with the first active layer, the second drain is connected to the first source and has an interval with the second source, and the second source and the second drain pass through the interlayer dielectric layer and the gate insulating layer in sequence and are in contact with the second active layer.

4. The compensation sub-pixel unit according to claim 3, further comprising:
a passivation layer, covering the interlayer dielectric layer, the first source, the first drain, the second source and the second drain;
a first via hole, disposed in the passivation layer and the interlayer dielectric layer, and exposing a portion of the second gate;
a second via hole, disposed in the passivation layer and the interlayer dielectric layer, and exposing a portion of the gate insulating layer;
a conductive layer, covering a portion of the passivation layer and filled in the first via hole and the second via hole, wherein the conductive layer is contacted with the second gate through the first via hole; and
a conductive hole, disposed in the conductive layer and located in the second via hole,
wherein the piezoelectric film is formed in the conductive hole and electrically connected to the second gate through the conductive layer.

5. The compensation sub-pixel unit according to claim 4, wherein the conductive layer comprises:
a metal conductive layer, contacted with the second gate through the first via hole; and
a transparent conductive layer, electrically connected to the metal conductive layer and filled in the second via hole, wherein the conductive hole is disposed in the transparent conductive layer.

6. The compensation sub-pixel unit according to claim 4, further comprising:
a flat layer, covering the passivation layer, the conductive layer and the piezoelectric film;
an anode layer, covering a portion of the flat layer, passing through the flat layer and the passivation layer in sequence, and being in contact with the first drain;
a pixel definition layer, covering the flat layer and the anode layer;
an organic light emitting layer, disposed in the pixel definition layer, and being in contact with the anode layer; and
a cathode layer, covering the pixel definition layer and the organic light emitting layer, and being in contact with the organic light emitting layer.

7. A method of driving a compensation sub-pixel unit according to claim 1, and the method comprising:
when the piezoelectric film is deformed to generate a voltage control signal, transmitting, by the switching transistor, a data voltage signal provided by the data voltage signal end to the first end of the driving transistor under an action of the voltage control signal, to make the driving transistor drive the compensation sub-pixel unit to emit light when the driving transistor is in an on state.

8. A method of fabricating a compensation sub-pixel unit, comprising:
forming a switching transistor and a driving transistor, wherein a first end of the switching transistor is connected to a data voltage signal end, a second end of the switching transistor is connected to a first end of the driving transistor, a control end of the driving transistor is connected to a gate voltage signal end, and a second end of the driving transistor is connected to a power signal end; and
forming a piezoelectric film connected to a control end of the switching transistor.

9. The method according to claim 8, wherein forming the switching transistor and the driving transistor comprises:
forming the switching transistor and the driving transistor on a same side of a substrate,
wherein,
the driving transistor comprises a first active layer, a first gate, a first source and a first drain, the first gate is formed as the control end of the driving transistor, the first source is formed as the first end of the driving transistor, and the first drain is formed as the second end of the driving transistor, and the switching transistor comprises a second active layer, a second gate, a second source and a second drain, the second gate is formed as the control end of the switching transistor, the second source is formed as the first end of the switching transistor, and the second drain is formed as the second end of the switching transistor.

10. The method according to claim 9, wherein forming the switching transistor and the driving transistor on the same side of the substrate comprises:

forming the first active layer and the second active layer disposed in the same layer on the substrate, wherein the first active layer and the second active layer have an interval therebetween;

forming a gate insulating layer on the substrate, wherein the gate insulating layer covers the first active layer and the second active layer;

forming the first gate and the second gate disposed in the same layer on the gate insulating layer, wherein the first gate and the second gate have an interval therebetween;

forming an interlayer dielectric layer on the gate insulating layer, wherein the interlayer dielectric layer covers the first gate and the second gate; and forming the first source, the first drain, the second source and the second drain disposed in the same layer on the interlayer dielectric layer, wherein the first drain and the first source have an interval therebetween, the first drain and the first source pass through the interlayer dielectric layer and the gate insulating layer in sequence and are in contact with the first active layer, the second drain is connected to the first source and have an interval with the second source, and the second source and the second drain passes through the interlayer dielectric layer and the gate insulating layer in sequence and are in contact with the second active layer.

11. The method according to claim 10, after forming the switching transistor and the driving transistor, and before forming the piezoelectric film, further comprising:

forming a passivation layer, wherein the passivation layer covers the interlayer dielectric layer, the first source, the first drain, the second source and the second drain;

forming a first via hole and a second via hole, wherein the first via hole and the second via hole are disposed in the passivation layer and the interlayer dielectric layer, and respectively expose a portion of the second gate and a portion of the gate insulating layer;

forming a conductive layer, wherein the conductive layer covers a portion of the passivation layer and is filled in the first via hole and the second via hole, and is contacted with the second gate through the first via hole; and forming a conductive hole, wherein the conductive hole is disposed in the conductive layer and located in the second via hole, and the piezoelectric film is formed in the conductive hole and electrically connected to the second gate through the conductive layer.

12. The method according to claim 11, wherein forming the conductive layer comprises:

forming a metal conductive layer, wherein the metal conductive layer is contacted with the second gate through the first via hole; and forming a transparent conductive layer, wherein the transparent conductive layer is electrically connected to the metal conductive layer and filled in the second via hole, and the conductive hole is disposed in the transparent conductive layer.

13. The method according to claim 11, after forming the piezoelectric film, further comprising:

forming a flat layer, wherein the flat layer covers the passivation layer, the conductive layer and the piezoelectric film;

forming an anode layer, wherein the anode layer covers a portion of the flat layer, and passes through the flat layer and the passivation layer in sequence and is in contact with the first drain;

forming a pixel definition layer, wherein the pixel definition layer covers the flat layer and the anode layer;

forming an organic light emitting layer, wherein the organic light emitting layer is disposed in the pixel definition layer, and is in contact with the anode layer; and forming a cathode layer, wherein the cathode layer covers the pixel definition layer and the organic light emitting layer, and is in contact with the organic light emitting layer.

14. A pixel structure, comprising: a plurality of pixel units, wherein each of the pixel units comprises a display sub-pixel unit and the compensation sub-pixel unit according to claim 1, and a shape of the display sub-pixel unit and the compensation sub-pixel unit comprises one or more of a rectangle, a diamond, a circle, an ellipse and a triangle.

15. The pixel structure according to claim 14, wherein the pixel unit comprises a first sub-pixel group and a second sub-pixel group, the first sub-pixel group comprises a first display sub-pixel unit, a second compensation sub-pixel unit and a third display sub-pixel unit that have a same area and are disposed in sequence in a same column, the second sub-pixel group comprises a first compensation sub-pixel unit, a second display sub-pixel unit and a third compensation sub-pixel unit that have a same area and are disposed in sequence in a same column, the first display sub-pixel unit and the first compensation sub-pixel unit are disposed in the same row, the second display sub-pixel and the second compensation sub-pixel unit are disposed in a same row, and the third display sub-pixel unit and the third compensation sub-pixel unit are disposed in a same row, the first display sub-pixel unit, the second display sub-pixel unit and the third display sub-pixel unit are all the display sub-pixel units, and the first compensation sub-pixel unit, the second compensation sub-pixel unit and the third compensation sub-pixel unit are all the compensation sub-pixel units.

16. The pixel structure according to claim 14, wherein the pixel unit comprises a first sub-pixel group, a second sub-pixel group and a third sub-pixel group, each of the first sub-pixel group, the second sub-pixel group and the third sub-pixel group comprises a first sub-pixel unit, a second sub-pixel unit and a third sub-pixel unit that have a same area and are disposed in sequence in a same column, the first sub-pixel unit and the second sub-pixel unit are the display sub-pixel units, and the third sub-pixel unit comprises the display sub-pixel unit and the compensation sub-pixel unit that have a same area and are disposed in a same column, the first sub-pixel unit in the first sub-pixel group, the third sub-pixel unit in the second sub-pixel group, and the second sub-pixel unit in the third sub-pixel group are disposed in sequence in a same row, the second sub-pixel unit in the first sub-pixel group, the first sub-pixel unit in the second sub-pixel group, and the third sub-pixel unit in the third sub-pixel group are disposed in sequence in a same row, and the third sub-pixel unit in the first sub-pixel group, the second sub-pixel unit in the second sub-pixel group, and the first sub-pixel unit in the third sub-pixel group are disposed in sequence in a same row.

17. The pixel structure according to claim 14, wherein the pixel unit comprises a first sub-pixel group, a second sub-pixel group, and a third sub-pixel group, the first sub-pixel group comprises a first display sub-pixel unit, a second display sub-pixel unit and a third compensation sub-pixel unit that are disposed in sequence in a same column, the second sub-pixel group comprises a second compensation sub-pixel unit, a first display sub-pixel unit and a third display sub-pixel unit that are disposed in sequence in a same column, the third sub-pixel group comprises a third display sub-pixel unit, a second display sub-pixel unit and a first compensation sub-pixel unit that are disposed in sequence in a same column, the first display sub-pixel unit, the second display sub-pixel unit and the third display sub-pixel unit are all the display sub-pixel units, and areas of both the second display sub-pixel unit and the third display sub-pixel unit are one-half of that of the first display sub-pixel unit, the first compensation sub-pixel unit, the second compensation sub-pixel unit and the third compensation sub-pixel unit are all the compensation sub-pixel units, and areas of both the second compensation sub-pixel unit and the third compensation sub-pixel unit are one-half of that the first compensation sub-pixel unit, the first display sub-pixel unit has a same area as that of the first compensation sub-pixel unit, the second display sub-pixel unit has a same area as that of the second compensation sub-pixel unit, and the third display sub-pixel unit has a same area as that of the third compensation sub-pixel unit.

18. The pixel structure according to claim 14, wherein the pixel unit comprises a first sub-pixel group, a second sub-pixel group, and a third sub-pixel group and a fourth sub-pixel group respectively disposed staggeredly with the first sub-pixel group and the second sub-pixel group, each the first sub-pixel group and the second sub-pixel group comprises a first display sub-pixel unit and a second display sub-pixel unit that are disposed alternately in a same row, the first display sub-pixel unit and the second display sub-pixel unit are the display sub-pixel units, and an area of the first display sub-pixel unit is larger than that of the second display sub-pixel unit, each of the third sub-pixel group and the fourth sub-pixel group comprises a third display sub-pixel unit and the compensation sub-pixel unit that are disposed alternately in a same row, the third display sub-pixel unit is the display sub-pixel unit, and an area of the compensation sub-pixel unit is the same as that of the third display sub-pixel unit, wherein the first display sub-pixel unit in the first sub-pixel group and the second display sub-pixel unit in the second sub-pixel group are disposed in a same column, and the second display sub-pixel unit in the first sub-pixel group and the first display sub-pixel unit in the second sub-pixel group are disposed in a same column, and the third display sub-pixel unit in the third sub-pixel group and the compensation sub-pixel unit in the fourth sub-pixel group are disposed in a same column, the compensation sub-pixel unit in the third sub-pixel group and the third display sub-pixel unit in the fourth sub-pixel group are disposed in a same column, and the third display sub-pixel unit and the compensation sub-pixel unit are respectively located among the first display sub-pixel units and the second display sub-pixel units that are adjacent to each other.

19. A display panel, comprising: the pixel structure according to claim 14.

* * * * *